US006729026B2

(12) United States Patent
Garcia et al.

(10) Patent No.: US 6,729,026 B2
(45) Date of Patent: May 4, 2004

(54) ROTATIONAL GRIP TWIST MACHINE AND METHOD FOR FABRICATING BULGES OF TWISTED WIRE ELECTRICAL CONNECTORS

(75) Inventors: Steven E. Garcia, Colorado Springs, CO (US); James A. Harden, Jr., Colorado Springs, CO (US)

(73) Assignee: Medallion Technology, LLC, Houston, TX (US)

( * ) Notice: Subject to any disclaimer, the term of this patent is extended or adjusted under 35 U.S.C. 154(b) by 199 days.

(21) Appl. No.: 09/782,888

(22) Filed: Feb. 13, 2001

(65) Prior Publication Data

US 2002/0108241 A1 Aug. 15, 2002

(51) Int. Cl.[7] .......................... H01R 43/04; H05K 3/30; D01H 7/02; B21D 11/14

(52) U.S. Cl. ........................ 29/882; 29/33 F; 29/33 M; 29/34 D; 29/838; 29/884; 57/2.3; 57/64; 57/293; 72/299

(58) Field of Search ................................ 140/149, 147; 72/299; 57/10 N, 2.3, 293, 309, 58.52, 63, 64, 314; 29/33 F, 825, 874, 882, 884, 240, 34 D, 826, 33 M, 838, 335, 876

(56) References Cited

U.S. PATENT DOCUMENTS 2,064,545 A 12/1936 Kleinmann et al.
2,234,641 A * 3/1941 Baumgartner ............... 140/149
2,752,580 A 6/1956 Shewmaker
2,828,455 A 3/1958 Kraay et al.
3,017,605 A 1/1962 Platz et al.
3,028,720 A * 4/1962 Houk ............................ 57/25
RE25,798 E 6/1965 Platz et al.
3,205,469 A 9/1965 Frank et al.
3,255,430 A 6/1966 Phillips
3,258,736 A 6/1966 Crawford et al.
3,277,560 A 10/1966 Frank et al.
3,319,217 A 5/1967 Phillips
3,333,225 A 7/1967 McNutt
3,400,358 A 9/1968 Byrnes et al.
3,402,466 A 9/1968 Phillips
3,612,369 A 10/1971 Grebe et al.
3,817,067 A 6/1974 Vorrehes et al.
4,022,057 A * 5/1977 Bachman et al. ............. 73/847
4,076,356 A 2/1978 Tamburro
4,119,206 A 10/1978 Woodman, Jr. et al.
4,237,942 A * 12/1980 Dietrich ....................... 140/105

(List continued on next page.)

FOREIGN PATENT DOCUMENTS

| | | | |
|---|---|---|---|
| JP | 55133355 | 10/1980 | |
| JP | 55133549 | 10/1980 | |
| JP | 568837 | 1/1981 | |
| JP | 63208237 | 8/1988 | |
| JP | 63293845 | 11/1988 | |
| JP | 3209173 | 9/1991 | |
| JP | 3209174 | 9/1991 | |
| WO | WO 9419518 A1 * | 9/1994 | ............ D02G/3/28 |

*Primary Examiner*—Allan N. Shoap
*Assistant Examiner*—Isaac N Hamilton
(74) *Attorney, Agent, or Firm*—John R. Ley

(57) ABSTRACT

Bulges in a wire having helically coiled strands are formed by untwisting the strands in an anti-helical direction at a predetermined position, to form an electrical connector from a length of the stranded wire. The wire is gripped by moving two spaced apart clamp members to a closed position and thereafter rotating the clamp members relative to one another in at least one complete relative revolution in a direction which is anti-helical relative to the coiled strands to form the bulge. The wire is gripped and rotated in the anti-helical direction for a relative rotational interval of greater than one-half, and preferably three-fourths, of a complete relative revolution. Thereafter, during the remaining rotational interval of each relative revolution, the clamp members are opened to permit the wire to be advanced to the next position where a bulge is to be formed.

34 Claims, 13 Drawing Sheets

U.S. PATENT DOCUMENTS

| | | | | | |
|---|---|---|---|---|---|
| 4,358,180 | A | | 11/1982 | Lincoln | |
| 4,422,583 | A | | 12/1983 | Maxner et al. | |
| 4,505,529 | A | | 3/1985 | Barkus | |
| 4,690,349 | A | | 9/1987 | Yamaguchi et al. | |
| 4,742,973 | A | | 5/1988 | Stomski et al. | |
| 4,773,877 | A | | 9/1988 | Krüger et al. | |
| 4,843,315 | A | | 6/1989 | Bayer et al. | |
| 4,889,496 | A | | 12/1989 | Neidich | |
| 4,911,645 | A | | 3/1990 | August et al. | |
| 5,014,419 | A | | 5/1991 | Cray et al. | |
| 5,033,785 | A | * | 7/1991 | Woolley, Jr. | 294/104 |
| 5,050,295 | A | | 9/1991 | Sullivan et al. | |
| 5,051,108 | A | | 9/1991 | Lincoln | |
| 5,054,192 | A | | 10/1991 | Cray et al. | |
| 5,106,310 | A | | 4/1992 | Krajewski et al. | |
| 5,112,232 | A | | 5/1992 | Cray et al. | |
| 5,129,830 | A | | 7/1992 | Krajewski et al. | |
| RE34,084 | E | | 9/1992 | Noschese | |
| 5,184,400 | A | | 2/1993 | Cray et al. | |
| 5,263,307 | A | * | 11/1993 | Hasui | 57/1 UN |
| 5,277,018 | A | * | 1/1994 | Pujol-Isern | 57/1 UN |
| 5,331,867 | A | * | 7/1994 | Carpenter et al. | 81/9.41 |
| 5,388,998 | A | | 2/1995 | Grange et al. | |
| 5,667,410 | A | | 9/1997 | Johnston | |
| 5,676,013 | A | * | 10/1997 | Kahlau | 72/299 |
| 5,865,051 | A | | 2/1999 | Otzen et al. | |
| 5,867,896 | A | * | 2/1999 | Watanabe | 29/825 |
| 5,904,059 | A | * | 5/1999 | Perna | 140/147 |
| 6,009,738 | A | * | 1/2000 | Beecher et al. | 72/299 |
| 6,043,666 | A | | 3/2000 | Kazama | |

* cited by examiner

ROTATIONAL GRIP TWIST MACHINE AND METHOD FOR FABRICATING BULGES OF TWISTED WIRE ELECTRICAL CONNECTORS

CROSS-REFERENCE TO RELATED INVENTIONS

This invention is related to inventions for High-Speed, High-Capacity Twist Pin Connector Fabricating Machine and Method, Rotational Grip Twist Machine and Method for Fabricating Bulges of Twisted Wire Electrical Connectors, and Pneumatic Inductor and Method of Electrical Connector Delivery and Organization, described in the concurrently-filed U.S. patent applications Ser. Nos. 09/782,987; 09/782,991; and 09/780,981, respectively, all of which are assigned to the assignee hereof, and all of which have at least one common inventor with the present application. The disclosures of these concurrently filed applications are incorporated herein by this reference.

FIELD OF THE INVENTION

This invention generally relates to the fabrication of electrical interconnectors used to electrically connect printed circuit boards and other electrical components in a vertical or z-axis direction to form three-dimensional electronic modules. More particularly, the present invention relates to a new and improved machine and method for fabricating z-axis interconnectors of the type formed from helically coiled strands of wire, in which at least one longitudinal segment of the coiled strands is untwisted in an anti-helical direction to expand the strands of wire into a resilient bulge. Bulges of the interconnector are then inserted into vias of vertically stacked printed circuit boards to establish an electrical connection through the z-axis interconnector between the printed circuit boards of the three dimensional module.

BACKGROUND OF THE INVENTION

The evolution of computer and electronic systems has demanded ever-increasing levels of performance. In most regards, the increased performance has been achieved by electronic components of ever-decreasing physical size. The diminished size itself has been responsible for some level of increased performance because of the reduced lengths of the paths through which the signals must travel between separate components of the systems. Reduced length signal paths allow the electronic components to switch at higher frequencies and reduce the latency of the signal conduction through relatively longer paths. One technique of reducing the size of the electronic components is to condense or diminish the space between the electronic components. Diminished size also allows more components to be included in a system, which is another technique of achieving increased performance because of the increased number of components.

One particularly effective approach to condensing the size between electronic components is to attach multiple semiconductor integrated circuits or "chips" on printed circuit boards, and then stack multiple printed circuit boards to form a three-dimensional configuration or module. Electrical interconnectors are then extended vertically, in the z-axis dimension, between the printed circuit boards which are oriented in the horizontal x-axis and y-axis dimensions. The z-axis interconnectors, in conjunction with conductor traces of each printed circuit board, connect the chips of the module with short signal paths for efficient functionality. The relatively high concentration of chips, which are connected by the three-dimensional, relatively short length signal paths, are capable of achieving very high levels of functionality.

The vertical electrical connections between the stacked printed circuit boards are established by using z-axis interconnectors. Z-axis interconnectors contact and extend through plated through holes or "vias" formed in each of the printed circuit boards. The chips of each printed circuit board are connected to the vias by conductor traces formed on or within each printed circuit board. The vias are formed in each individual printed circuit board of the three-dimensional modules at the same locations, so that when the printed circuit boards are stacked in the three-dimensional module, the vias of all of the printed circuit boards are aligned vertically in the z-axis. The z-axis interconnectors are then inserted vertically through the aligned vias to establish an electrical contact and connection between the vertically oriented vias of each module.

Because of differences between the individual chips on each printed circuit board and the necessity to electrically interconnect to the chips of each module in a three-dimensional sense, it is not always required that the z-axis interconnectors electrically connect to the vias of each printed circuit board. Instead, those vias on those circuit boards for which no electrical connection is desired are not connected to the traces of that printed circuit board. In other words, the via is formed but not connected to any of the components on that printed circuit board. When the z-axis interconnector is inserted through such a via, a mechanical connection is established, but no electrical connection to the other components of the printed circuit board is made. Alternatively, each of the z-axis interconnectors may have the capability of selectively contacting or not contacting each via through which the interconnector extends. Not contacting a via results in no electrical connection at that via. Of course, no mechanical connection exists at that via either, in this example.

A number of different types of z-axis interconnectors have been proposed. One particularly advantageous type of z-axis interconnector is known as a "twist pin." Twist pin z-axis interconnectors are described in U.S. Pat. Nos. 5,014,419, 5,064,192, and 5,112,232, all of which are assigned to the assignee hereof.

An example of a prior art twist pin 50 is shown in FIG. 1. The twist pin 50 is formed from a length of wire 52 which has been formed conventionally by helically coiling a number of outer strands 54 around a center core strand 56 in a planetary manner, as shown in FIG. 2. At selected positions along the length of the wire 52, a bulge 58 is formed by untwisting the outer strands 54 in a reverse or anti-helical direction. As a result of untwisting the strands 54 in the anti-helical direction, the space consumed by the outer strands 54 increases, causing the outer strands 54 to bend or expand outward from the center strand 56 and create a larger diameter for the bulge 58 than the diameter of the regular stranded wire 52. The laterally outward extent of the bulge 58 is illustrated in FIG. 3, compared to FIG. 2.

The strands 54 and 56 of the wire 52 are preferably formed from beryllium copper. The beryllium copper provides necessary mechanical characteristics to maintain the shape of the wire in the stranded configuration, to allow the outer strands 54 to bend outward at each bulge 58 when untwisted, and to cause the bulges 58 to apply resilient radial contact force on the vias of the printed circuit boards. To facilitate and enhance these mechanical properties, the twist pin will typically be heat treated after it has been fabricated.

Heat treating anneals or hardens the beryllium copper slightly and tempers the strands 54 at the bulges 58, causing enhanced resiliency or spring-like characteristics. It is also typical to plate the fabricated twist pin with an outer coating of gold. The gold plating establishes a good electrical connection with the vias. To cause the gold-plated exterior coating to adhere to the twist pin 50, usually the beryllium copper is first plated with a layer of nickel, and the gold is plated on top of the nickel layer. The nickel layer adheres very well to the beryllium copper, and the gold adheres very well to the nickel.

The bulges 58 are positioned at selected predetermined distances along the length of the wire 52 to contact the vias 60 in printed circuit boards 62 of a three-dimensional module 64, as shown in FIG. 4. Contact of the bulge 58 with the vias 60 is established by pulling the twist pin 50 through an aligned vertical column of vias 60 in the module 64. The outer strands 54 of the wire 52 have sufficient resiliency when deflected into the outward protruding bulge 58, to resiliently press against an inner surface of a sidewall 66 of each via 60, and thereby establish the electrical connection between the twist pin 50 and the via 60, as shown in FIG. 5. In those circumstances where an electrical connection is not desired between the twist pin 50 and the components of a printed circuit board, the via 60 is formed but no conductive traces connect the via to the other components of the printed circuit board. One such via 60' is shown in FIG. 4. The sidewall 66 of the via 60' extends through the printed circuit board, but the via 60' is electrically isolated from the other components on that printed circuit board because no traces extend beyond the sidewall 66. Inserting a bulge 58 of the twist pin 50 into a via 60' that is not connected to the other components of a printed circuit board eliminates an electrical connection from that twist pin to that printed circuit board, but establishes a mechanical connection between the twist pin and the printed circuit board which helps support and hold the printed circuit board in the three-dimensional module.

To insert the twist pins 50 into the vertically aligned vias 60 of the module 64 with the bulges 58 contacting the inner surfaces 66 of the vias 60, a leader 68 of the regularly-coiled strands 54 and 56 extends at one end of the twist pin 50. The strands 54 and 56 at a terminal end 70 of the leader 68 have been welded or fused together to form a rounded end configuration 70 to facilitate insertion of the twist pin 50 through the column of vertically aligned vias. The leader 68 is of sufficient length to extend through all of the vertically aligned vias 60 of the assembled stacked printed circuit boards 62, before the first bulge 58 makes contact with the outermost via 60 of the outermost printed circuit board 62. The leader 68 is gripped and the twist pin 50 is pulled through the vertically aligned vias 60 until the bulges 58 are aligned and in contact with the vias 60 of the stacked printed circuit boards. To position the bulges in contact with the vertically aligned vias, the leading bulges 58 will be pulled into and out of some of the vertically aligned vias until the twist pin 50 arrives at its final desired location. The resiliency of the strands 54 allow the bulges 58 to move in and out of the vias without losing their ability to make sound electrical contact with the sidewall of the final desired via into which the bulges 58 are positioned. Once appropriately positioned, the leader 68 is cut off so that the finished length of the twist pin 50 is approximately at the same level or slightly beyond the outer surface of the outer printed circuit board of the module 64. A tail 72 at the other end of the twist pin 50 extends a shorter distance beyond the last bulge 58. The strands 54 and 56 at an end 74 of the tail 72 are also fused together. The length of the tail 72 positions the end 74 at a similar position to the location where the leader 68 was cut on the opposite side of the module. However, if desired, the length of the tail 72 or the remaining length of the leader 68 after it was cut may be made longer or shorter. Allowing the tail 72 and the remaining portion of the leader 68 to extend slightly beyond the outer printed circuit boards 62 of the module 64 facilitates gripping the twist pin 50 when removing it from the module 64 to repair or replace any defective components. In those circumstances where it is preferred that the ends of the twist pin do not extend beyond the outside edges of the three-dimensional module, an overlay may be attached to the outermost printed circuit boards to make the ends of the twist pin flush with the overlay.

The ability to achieve good electrical connections between the vias 60 of the printed circuit boards depends on the ability to precisely position the location of the bulges 58 along the length of wire 52. Otherwise, the bulges 58 would be misaligned relative to the position of the vias, and possibly not create an adequate electrical connection. Therefore, it is important in the formation of the twist pins 50 that the bulges 58 be separated by predetermined intervals 76 (FIG. 1) along the length of the wire 52. The position of the bulges 58 and the length of the intervals 76 depend on the desired spacing between the printed circuit boards 62 of the module 64. The amount of bending of each of the outer conductors 54 at each bulge 58 must also be controlled so that each of the bulges 58 exercises enough force to make good electrical contact with the vias. Moreover, the amount of outward deflection or bulging of each of the bulges 58 must be approximately uniform so that none of the bulges 58 experiences permanent deformation when the bulge is pulled through the vias. Distortion-induced disparities in the dimensions of the bulges adversely affect their ability to make sound electrical connections with the vias 60. Further still, each twist pin 50 should retain a coaxial configuration along its length without slight angular bends at each bulge and without any bulge having asymmetrical characteristics. The coaxial configuration facilitates inserting the twist pin through the vertically aligned vias, maintaining the resiliency of the bulges, and establishing good electrical contact with the vias.

The requirements for close tolerances and precision in the twist pins are made more significant upon recognizing the very small size of the twist pins. The typical sizes of the most common sizes of helically-coiled wire are about 0.0016, 0.0033 and 0.0050 in. in diameter. The diameters of the strands 54 and 56 used in forming these three sizes of wires are 0.005, 0.0010, and 0.0015 in., respectively. The typical length of a twist pin having four to six bulges which extends through four to six printed circuit boards will be about 1 to 1.5 inches. The outer diameter of each bulge 58 will be approximately two to three times the diameter of the regularly stranded wire in the intervals 76. The tolerance for locating the bulges 58 between intervals 76 is in the neighborhood of 0.002 in. The weight of a typical four-bulge twist pin is about 0.0077 grams, making it so light that handling the twist pin is very difficult. Handling each twist pin is also complicated because its small dimensions do not easily resist the forces that are necessary to manually manipulate the twist pin without bending or deforming it. It is not unusual that a complex 4 in.×4 in. module 64 may require the use of as many as 22,000 twist pins. Thus, the relatively large number of twist pins necessary to assemble each three-dimensional module require an ability to fabricate a relatively large number of the twist pins in an efficient and rapid manner.

A general technique for fabricating twist pins is described in the three previously-identified U.S. patents. That described technique involves advancing the length of the stranded wire, clamping the stranded wire above and below the location where the bulge is to be formed, fusing the outer strands of the wire to the core strand of the wire preferably by laser welding at the locations above and below the bulge, and rotating the wire between the two clamps in an anti-helical direction to form the bulge.

In a prior art implementation of this twist pin fabrication technique, a wire feeder advanced an end of the helically stranded wire which was wound on a spool. The wire feeder employed a lead screw mechanism driven by an electric motor to advance the wire and unwind it from the spool. A solenoid-controlled clamp was connected to the lead screw mechanism to grip the wire as the lead screw mechanism advanced as much of the stranded wire from the spool as was necessary for use at each stage of fabrication of the twist pin. To advance more wire, the clamp opened and the lead screw mechanism retracted in a reverse movement. The clamp then closed again on the wire and the electric motor again advanced the lead screw mechanism.

While this prior art wire feeder mechanism was functional, the reciprocating movement of the feeder mechanism reduced efficiency and slowed the speed of operation. Half of the reciprocating movement, the return movement to the beginning position, was wasted motion. Moreover, the relatively high inertia and mass of the lead screw, clamp and motor armature required extra force and hence time to execute the reversing movements necessary for reciprocation. Furthermore, the rotational mass of the wire wound on the spool limited the acceleration rate at which the lead screw could unwind the wire off of the spool. The rotational mass was frequently sufficient enough to cause the wire to slip in the clamp carried by the lead screw. Slippage at this location resulted in the formation of the bulges at incorrect positions and incorrect lengths of the leader 68 and the internal lengths 76. The desire to avoid slippage also limited the operating speed of the fabricating equipment.

The prior art bulge forming mechanism included two clamping devices which closed on the wire above and below at the location where each bulge was to be formed. The clamping devices held a wire while a laser beam fused the outer strands 54 to the center core strand 56 at those locations. Thereafter, the lower clamping device was rotated in an anti-helical direction while the upper clamping device held the wire stationary, thereby forming the bulge 58.

The lower clamping device was carried by a sprocket, and the wire extended through a hole in the center of the sprocket. A first pneumatic cylinder was connected to the clamping device to cause the clamping device to grip the wire. A chain extended around the sprocket and meshed with the teeth of the sprocket. One end of the chain was connected to a spring, and the other end of the chain was connected to a second pneumatic cylinder. When the second pneumatic cylinder was actuated, its rod and piston pulled the chain to rotate the sprocket by the amount of the piston throw. Upon reaching the end of its throw, the rod and cylinder of the second pneumatic cylinder was returned in the opposite direction to its original position by the force of the spring which pulled the chain in the opposite direction. Of course, moving the chain to its original position also rotated the sprocket in the opposite direction to its original position.

After gripping the wire by activating the first pneumatic cylinder, the second pneumatic cylinder was activated to rotate the sprocket in the anti-helical direction. However, the throw of the second pneumatic cylinder, and the amount of rotation of the sprocket, was insufficient to completely form a bulge with a single rotational movement. Instead, two separate rotational movements were required to completely form the bulge. After the rotation, the lower clamping device released its grip on the wire while the sprocket rotated in the reverse direction. Upon rotating back to the initial position again, the lower clamping device again gripped the wire and another rotational movement of the sprocket and gripping device was executed to finish forming the bulge.

By providing only a limited amount of rotational movement so as to require two rotations to form the bulge, a significant amount of time was consumed in forming each bulge. The latency of reversing the movement of the components and executing multiple bulge forming movements slowed the fabrication rate of the twist pins. The rotational mass of the sprocket and the clamping mechanism with its attached solenoid activation clamping device reduced the rate at which these elements could be accelerated, and also constituted a limitation on the speed at which twist pins could be fabricated. Apart from the rotational mass issues, acceleration had to be limited to avoid inducing wire slippage. The need to reverse the direction of movement of numerous reciprocating components limited the rate at which the twist pins bulges could be fabricated.

After formation of the bulges in the prior art twist pin fabricating machine, the wire with the formed bulges was cut to length to form the twist pin. The leader of the twist pin extended into a venturi through which gas flowed. The effect of the gas flowing through the venturi was to induce a slight tension force on the wire, and hold it while a laser beam severed the wire at the desired length. The laser beam fused the ends 70 and 74 of the strands 54 and 56 as it severed the fabricated twist pin from the length of wire. The tension force induced on the wire by the gas flowing through the venturi propelled the twist pins into a random pile called a "haystack." After a sufficient number of twist pins had accumulated, they were placed into a separate sorting and singulating machine which ultimately delivered the twist pins one at a time in a specific orientation into a carrier. The pins were later heat treated and transferred from the carrier and inserted into the three-dimensional modules.

The process of sorting the twist pins, orienting them, delivering them into the carrier, and making sure that the twist pins were received properly within the carrier required considerable human intervention and machine handling after the twist pins were fabricated. Occasionally the twist pins would be lodged in tubes which guided the twist pins into the carrier by an air flow. Delivering the twist pins into the receptacles in the carrier was also difficult, and human intervention was required to assure that the twist pins were properly received in the receptacles. Twist pin sorting also occasionally resulted in jamming and bending the twist pins. In general, the post-fabrication processing steps required to organize the twist pins for their subsequent use contributed to overall inefficiency.

These and other considerations pertinent to the fabrication of twist pins have given rise to the new and improved aspects of the present invention.

SUMMARY OF THE INVENTION

One improved aspect of the present invention involves forming bulges in helically coiled wire in such a manner that allows twist pins to be more rapidly and more efficiently fabricated compared to previous techniques. Another improved aspect of the present invention involves fabricating twist pins having more uniform, more controlled, more precisely positioned and more symmetrically shaped bulges. Another improved aspect of the present invention involves fabricating bulges and twist pins without using reciprocal motions. The lost motion of return strokes and the latency associated with reciprocation decreases the speed of fabricating the twist pins. The necessity to accelerate relatively massive components is avoided by using continuous movements or intermittent movements which do not involve changes of direction and which tend to conserve energy and momentum without requiring acceleration of massive components. Another improved aspect is that wire slippage is avoided during the fabrication of the bulges. Other aspects of the present invention allow the bulges and twist pins of different sizes to be fabricated conveniently using the same machine.

In one principal regard, the present invention relates to a bulge forming mechanism for forming bulges in a wire having helically coiled strands by untwisting the strands in an anti-helical direction at a predetermined position to form an electrical connector from a segment of a length of the wire. The bulge forming mechanism includes a first gripping assembly including a first clamp member and a first actuator. The first clamp member moves to a closed position to grip the wire and prevent the wire from moving relative to it and moves to an open position in which the wire is free to move relative to it. The first actuator selectively moves the first clamp member into the open and closed positions. The bulge forming mechanism also includes a second gripping assembly which includes a second clamp member and second actuator. The second clamp member moves to a closed position to grip the wire and prevent the wire from moving relative to it and moves to an open position in which the wire is free to move relative to the second clamp member. The second actuator selectively moves the second clamp member into the open and closed positions. A rotating carrier interconnects the first and second gripping assemblies to rotate the first and second clamp members relative to one another in at least one complete relative revolution in a single relative rotational direction which is anti-helical relative to the strands of the wire, thereby forming the bulge. The first and second clamp members spaced above and below the location where the bulge is formed.

In another principal regard, the present invention relates to a method of forming bulges in a wire having helically coiled strands by untwisting the strands in an anti-helical direction at a predetermined position to form an electrical connector from a length of the wire. The method comprises the steps of gripping the wire with a first clamp member and preventing the wire from moving relative to the first clamp member by moving the first clamp member to a closed position, gripping the wire with a second clamp member and preventing the wire from moving relative to the second clamp member by moving the second clamp member to a closed position, positioning the first and second clamp members at spaced apart locations above and below the location where a bulge is to be formed, rotating the first and second clamp members relative to one another in at least one complete relative revolution in a relative rotational direction which is anti-helical relative to the strands of the wire, and moving the first and second clamp members to the closed position during a relative rotational interval of greater than one-half of a complete relative revolution of the clamp members.

Preferably, the first and second clamp members are moved to the closed position during a relative rotational interval of approximately three-fourths of a complete relative revolution. Preferably the first and second clamp members are moved to the open position to release the grip on the wire and to allow the wire to move relative to the clamp members during a relative rotational interval of less than one-half of a complete relative revolution of the clamp members. While both clamp members are in the open position, the wire is advanced longitudinally to establish the next position to form a bulge or to establish a position where the segment of wire is severed from the remaining wire. While the clamp members are in the open position, the relative rotation of the clamp members may be slowed, stopped or otherwise controlled to provide sufficient time for advancing the wire, if necessary or desired.

A preferred technique of avoiding wire slippage involves repositioning the strands of the wire into a cross-sectional configuration having a non-uniform radial component when gripping the strands. At least one of the clamp members includes jaw members with crescent shaped contact surfaces which reposition the strands into the cross-sectional configuration having the non-uniform radial component. The non-uniform radial component of the cross-sectional configuration allows more torque to be applied to the wire without slippage.

In a preferred embodiment, the first clamp member is retained in a stationary position and the second clamp member is rotated in complete revolutions in a single rotational direction relative to the first clamp member. The second clamp member is moved to the open and closed positions at predetermined points during each revolution. The second actuator preferably includes a cam wheel which has at least one actuating arm extending outward beyond a peripheral edge of the rotating carrier which carries the cam wheel. Rotation of the carrier brings the actuating arm into contact with a trip pin, and the continued rotation of the carrier with the actuating arm in contact with a trip pin rotates the cam wheel. As the cam wheel rotates, an eccentric surface of the cam wheel pivots a lever arm of the second clamp member to move the second clamp member into the open and closed positions. Preferably at least two actuator arms and two trip pins are located to open and close the second clamp member at the predetermined positions during each of its revolutions. The second clamp member preferably includes a pair of separated lever arms between which the cam wheel and its cam surfaces are positioned to pivot the lever arms in a further separated condition to open the second clamp member and to allow the lever arms to resiliently move back to a normal less-separated position to close the second clamp member.

The first clamp member is preferably moved to the closed position by an electrical actuator, which is triggered by a sensor which senses the position of the actuator arms of the cam wheel of the second actuator. The first clamp member is normally resilient to move to the open position. By independently actuating the movements of the clamp members, their open and closed positions may be controlled independently of the open and closed positions of the second rotating clamp member. The clamp members are preferably formed of spring tempered material to achieve the normal open and closed positions and to create inherent bias force when the clamp members are deflected.

The relative rotation of the clamp members in complete revolutions allows a bulge to be formed during a relative rotational interval of less than one complete revolution. Multiple incomplete movements in the anti-helical direction are avoided when forming each bulge. The single bulge-forming movement results in twist bulges which have more uniform and symmetrical characteristics. The rotational interval during which the clamp members are open allows the bulges to be more precisely located along the segment of wire and allows the ends of the segment to be accurately positioned for severing. As a result, the twist pin has more consistent dimensions and characteristics, because the single rotational movement of creating each bulge is less likely to induce bends or other characteristics in the twist pin which make it non-coaxial along its length. The continual relative rotational movement of the clamp members allows the twist pins to be fabricated without incurring the inefficient lost motion and the latency associated with reciprocal motions, thereby increasing the speed and efficiency of fabricating the twist pins. The necessity to accelerate relatively massive components is avoided by using the continuous relative rotational movements which do not involve changes of direction and which conserve energy and momentum without requiring changes of direction and substantial acceleration of massive components. These improvements are achieved while still allowing twist pins of different sizes and dimensions to be fabricated.

A more complete appreciation of the present invention and its scope may be obtained from the accompanying drawings, which are briefly summarized below, from the following detailed descriptions of presently preferred embodiments of the invention, and from the appended claims.

DETAILED DESCRIPTION

Figure 6:
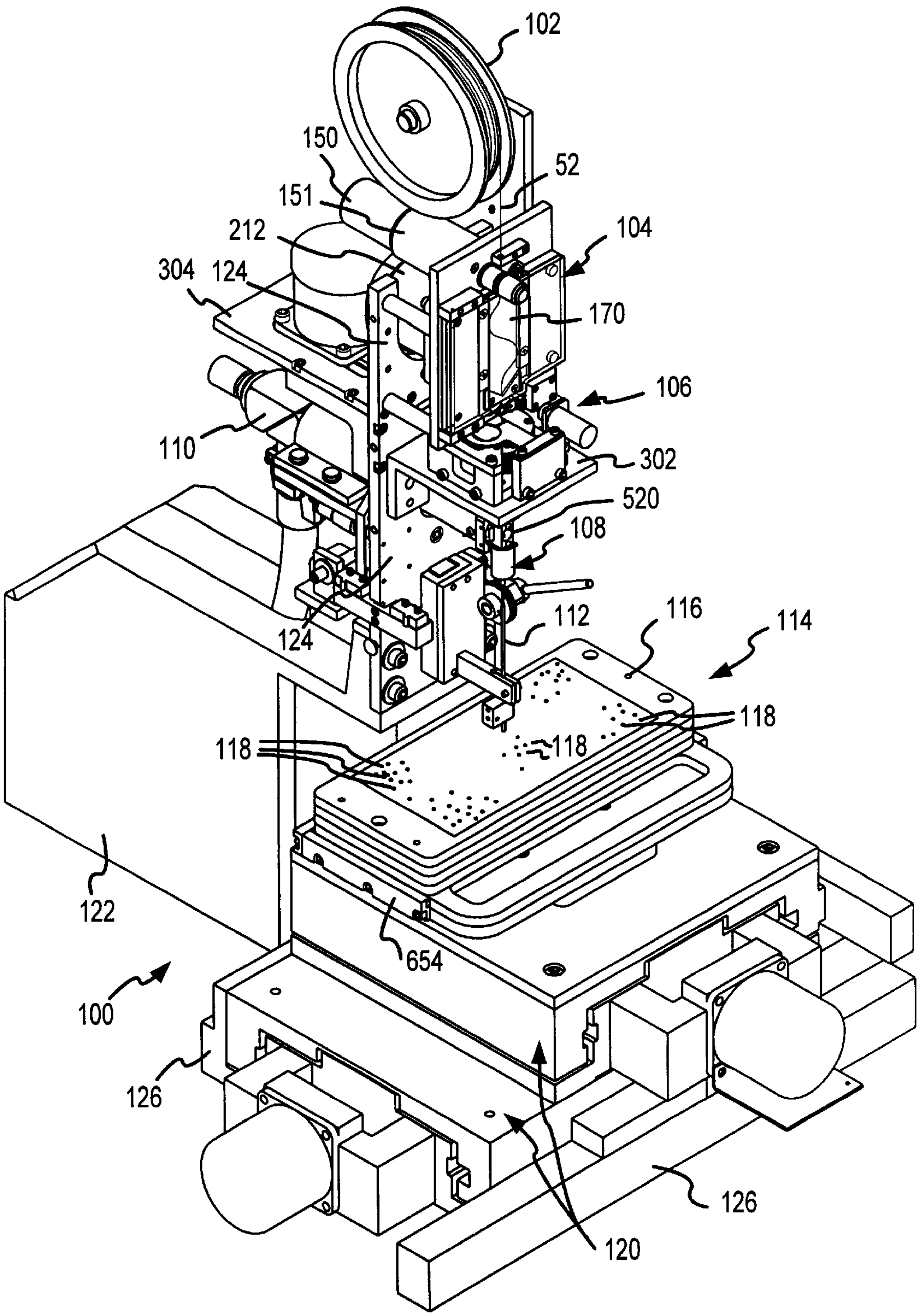
FIG. 6 is a perspective view of a machine for fabricating twist pins of the type shown in FIG. 1, in accordance with the present invention.

The present invention is preferably incorporated in an improved machine 100 which fabricates twist pins 50 (FIG. 1), and an improved methodology for fabricating bulges 58 (FIG. 1) of twist pins, as shown and understood by reference to FIG. 6. The twist pins are fabricated from the gold-plated, beryllium-copper wire 52 which is wound on a spool 102. A wire feed mechanism 104 of the machine 100 unwinds the wire 52 from the spool 102 and accurately feeds the wire to a bulge forming mechanism 106 which is located below the wire feed mechanism 104. The bulge forming mechanism forms the bulges 58 (FIG. 1) at precise locations along the length of the wire 52. The positions where the bulges 58 are formed are established by the advancement of the wire 52 by the wire feed mechanism 104. The bulge forming mechanism 106 forms the bulges by gripping the wire 52 and untwisting the wire in the reverse or anti-helical direction.

After all of the bulges of the twist pin 50 (FIG. 1) have been formed by the bulge forming mechanism 106, the wire feed mechanism 104 advances the twist pin configuration formed in the wire 52 into a pneumatic inductor mechanism 108. With the twist pin positioned in the inductor mechanism 108, the end 74 of the tail 72 or the end 70 of the leader 68 (FIG. 1) of the twist pin configuration is located below the bulge forming mechanism 106. A laser beam device 110 is activated and its emitted laser beam melts the wire 52 at the ends 70 and 74 (FIG. 1), thus completing the formation of the twist pin 50 by severing the fabricated twist pin from the remaining wire 52.

Figure 4:
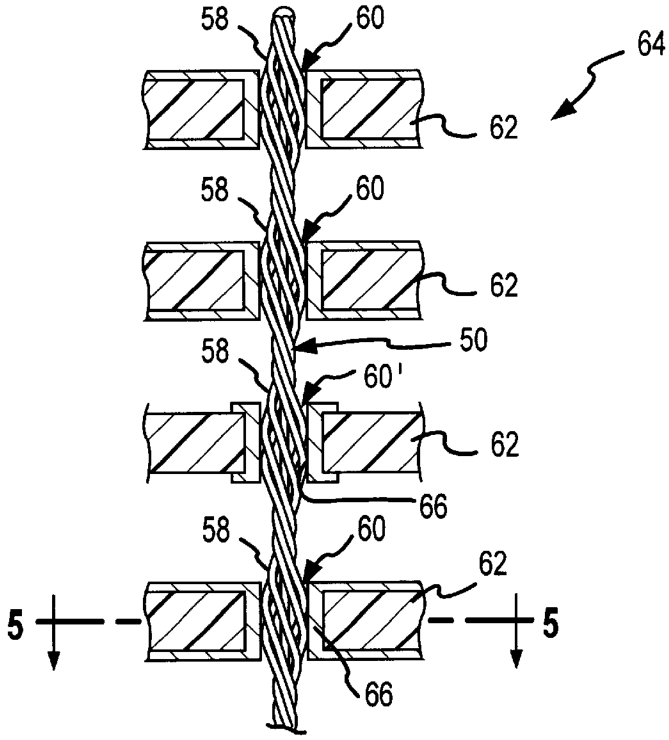
FIG.4 PRIOR ART
FIG. 4 is a partial, vertical cross-sectional view of a prior art three-dimensional module, formed by multiple printed circuit boards and illustrating a single twist pin of the type shown in FIG. 1 extending through vertically aligned vias of the printed circuit boards of the module.
Figure 2:
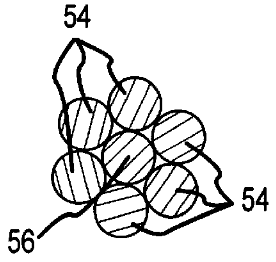
FIG.2 PRIOR ART
FIG. 2 is an enlarged, cross-sectional view of the twist pin shown in FIG. 1, taken substantially in the plane of line 2—2 shown in FIG. 1.
Figure 5:
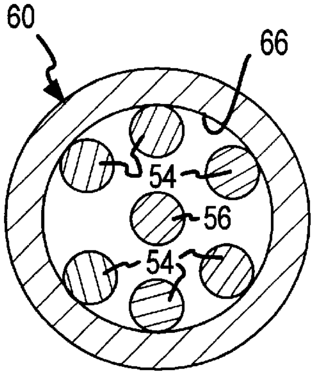
FIG.5 PRIOR ART
FIG. 5 is an enlarged cross-sectional view of the twist pin within a via shown in FIG. 4, taken substantially in the plane of line 5—5 shown in FIG. 4.
Figure 3:
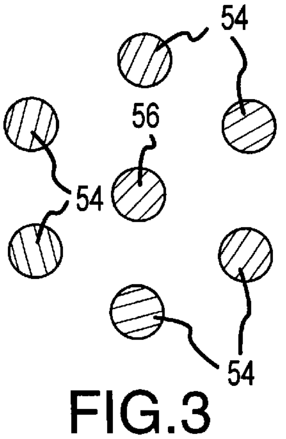
FIG.3 PRIOR ART
FIG. 3 is an enlarged, cross-sectional view of the twist pin shown in FIG. 1, taken substantially in the plane of line 3—3 shown in FIG. 1.

The severed twist pin is released into the pneumatic inductor mechanism 108. The inductor mechanism 108 applies a slightly negative relative gas or air pressure or suction to the twist pin, and creates a gas flow which conveys the severed twist pin downward through a tube 112 of a twist pin receiving mechanism 114. The twist pin receiving mechanism 114 includes a cassette 116 into which receptacles 118 are formed in a vertically oriented manner. The tube 112 of the inductor mechanism 108 delivers one twist pin into each of the receptacles 118. Once a twist pin occupies one of the receptacles 118, an x-y movement table 120 moves the cassette 116 to position an unoccupied receptacle 118 beneath the tube 112. The x-y movement table 120 continues moving the cassette 116 in this manner until all of the receptacles 118 have been filled with fabricated twist pins. Once the cassette 116 has been filled with twist pins, the filled cassette is removed and replaced with an empty cassette, whereupon the process continues. Later after heat treatment, the fabricated twist pins are removed from the cassette 116 and inserted into the vias 60 to form the three-dimensional module 64 (FIG. 4).

The operation of the wire feed mechanism 104, the bulge forming mechanism 106, the inductor mechanism 108, the laser beam device 110 and the twist pin receiving mechanism 114 are all controlled by a machine microcontroller or microcomputer (referred to as a "controller," not shown) which has been programmed to cause these devices to execute the described functions. The spool 102, the wire feed mechanism 104, the bulge forming mechanism 106, the inductor mechanism 108 and the laser beam device 110 are interconnected and attached to a first frame element 122. A support plate 124 extends vertically upward from the first frame element 122, and the wire feed mechanism 104, the bulge forming mechanism 106 and the inductor mechanism 108 are all connected to or supported from the support plate 124. The twist pin receiving mechanism 114 is connected to a second frame element 126. Both frame elements 122 and 126 are connected rigidly to a single structural support frame (not shown) for the entire machine 100. All of the components shown and described in connection with FIG. 6 are enclosed within a housing (not shown).

More details concerning the twist pin fabricating machine 100 and method of fabricating twist pins are described in the above-referenced and concurrently-filed U.S. patent application Ser. No. 09/782,987. Specific details concerning the wire feed mechanism 104 are described in the above-referenced and concurrently-filed U.S. patent application Ser. No. 09/782,991. However, some of the more specific but nevertheless general details of the wire feed mechanism 104 are next described as context for the present invention.

Figure 7:
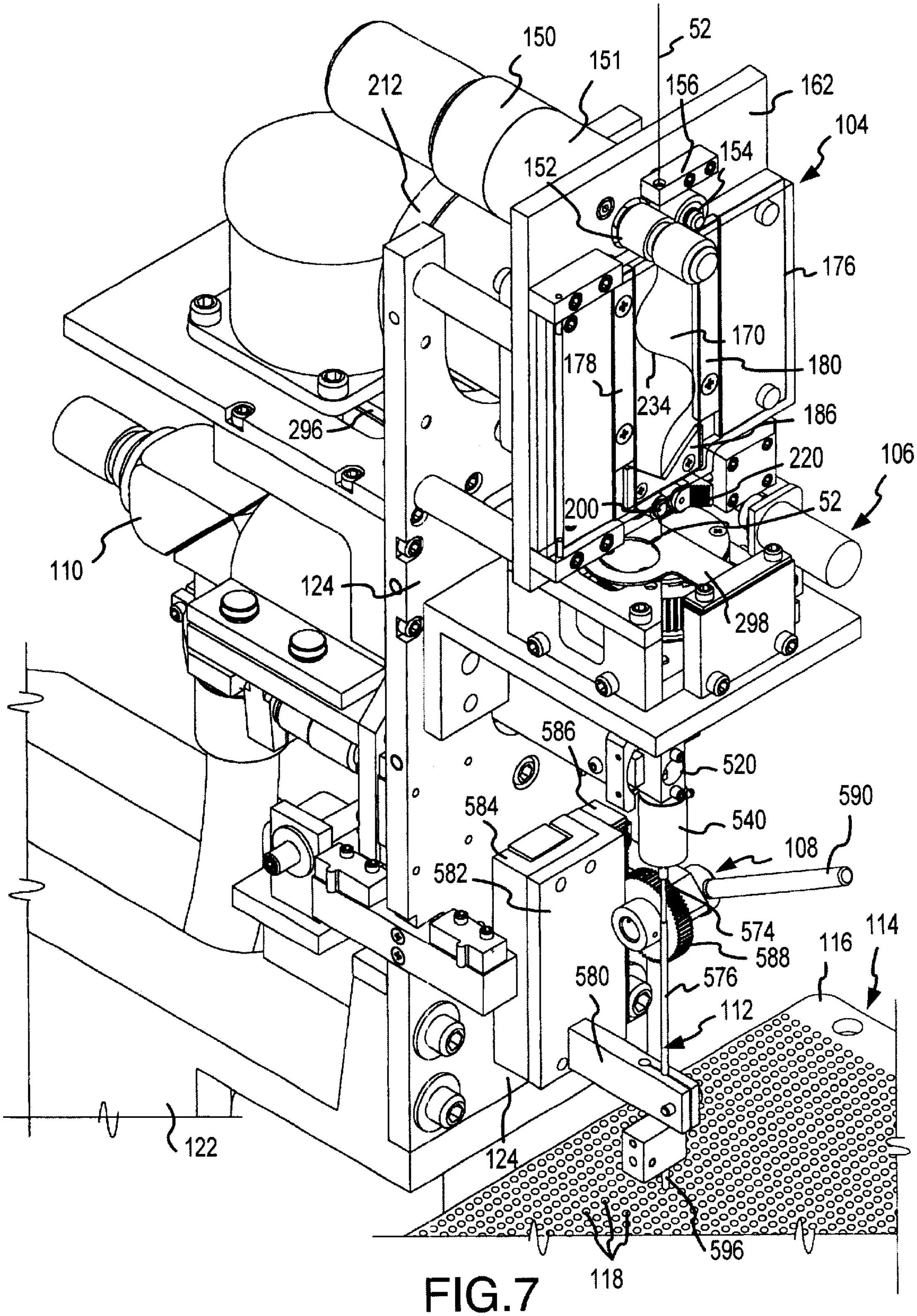
FIG. 7 is an enlarged perspective view of a wire feed mechanism, a bulge forming mechanism, an inductor mechanism and a portion of a twist pin receiving mechanism of the twist pin fabricating machine shown in FIG. 6.

As shown in FIGS. 6 and 7, the wire feed mechanism 104 includes a pre-feed electric motor 150 that rotates a connected, speed-reducing gear head 151. A capstan 152 is connected to and rotated by the gear head 151. The wire 52 extends between the capstan 152 and an adjacent idler roller 154. The outer surfaces of the capstan 152 and the roller 154 apply sufficient frictional force on the wire 52 to firmly grip the wire between the capstan 152 and the roller 154 and to advance the wire without slippage when the capstan 152 is rotated. Rotating the capstan 152 to advance the wire 52 also unwinds wire 52 from the spool 102.

The rotating capstan 152 advances the wire 52 into a cavity 170. A front transparent door 176 covers the cavity 170. Vertically extending contact bars 178 and 180 are positioned on the opposite lateral sides of the cavity 170. A cavity exit guide 186 is located at the bottom of the cavity 170. An exit hole extends vertically downward through the cavity guide 186 at a position which is directly vertically below the contact point of the pre-feed capstan 152 and the roller 154 and directly above the point where the wire 52 enters the bulge forming mechanism 106.

The wire 52 is withdrawn from the cavity 170 by rotating a wire feed spindle 200. A precision feed motor 212 is connected to rotate the spindle 200. A pinch roller 220 is biased toward the spindle 200 to establish good frictional contact of the wire 52 between the spindle 200 and the pinch roller 220 to precisely advance the wire 52 by an amount determined by the rotation of the precision feed motor 212.

Figure 1:
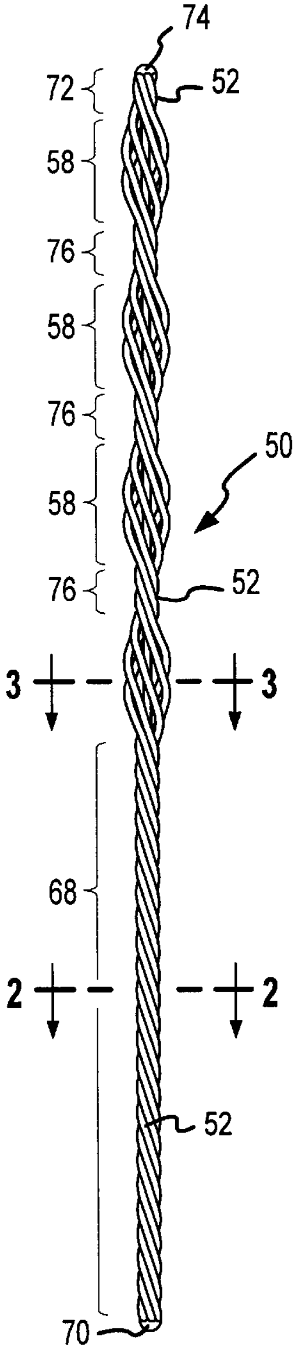
FIG.1 PRIOR ART
FIG. 1 is a side elevational view of a prior art twist pin.

The wire is withdrawn or unwound from the spool by operating the pre-feed motor 150 and pre-feed capstan 152 independently of operating the precision feed motor 212 and the spindle 200. A slack amount of wire is accumulated in the cavity 170 as an S-shaped configuration 234. The S-shaped configuration 234 consumes enough slack wire within the cavity to form at least one twist pin. The slack wire of the S-shaped configuration 234 is not under tension or resistance from the spool 102 (FIG. 6), thereby allowing the wire 52 to be advanced precisely from the cavity 170 into the bulge forming mechanism 106 by the precision feed motor 212 and the spindle 200. The slack amount of wire consumed by the S-shaped configuration 234 in the cavity 170 exhibits very little inertia and mass, thereby allowing the precision feed motor 212 and spindle 200 to advance a desired amount of wire quickly, without having to overcome the adverse influences of attempting to accelerate a significant mass of wire, accelerate the rotation of the spool 102, or to overcome significant inertia of the wire on the spool and the spool while unwinding the wire. The effects of high mass under high acceleration conditions, and the effects of inertia, can induce slippage in the wire as it is advanced under high speed manufacturing conditions, thereby resulting in forming the bulges 58 at incorrect positions and in undesired lengths of the leader 68, the tail 72 and the interval 76 of the twist pin 50 (FIG. 1).

As the wire in the cavity 170 is fed out by the precision feed motor 212 and spindle 200, the pre-feed motor 150 and the capstan 152 feed more wire into the cavity to maintain the S-shaped configuration 234. The pre-feed motor 150 is energized and operates to advance wire from the spool into the cavity until bends of the S-shaped configuration 234 contact the contact bars 178 and 180. When the bends of the S-shaped configuration 234 contact both contact bars 178 and 180, the power to the pre-feed motor 150 is terminated. Thereafter, as the precision feed motor 212 and spindle 200 withdraw wire from the cavity 170, causing the S-shaped configuration 234 to become narrower and withdraw the bends of the S-shaped configuration from the contact bars 178 and 180, power is again supplied to the pre-feed motor 150 to advance more wire into the cavity 170 until the S-shaped configuration is re-established.

The precision feed motor 212 is preferably a conventional stepper motor. As such, the times of its rotation and the extent of its rotation are precisely controlled by pulse signals which cause the stepper motor 212 to rotate in a predetermined increment of a full rotation for each pulse delivered. For example, one pulse might cause the stepper motor 212 to rotate one rotational increment or one degree. A predetermined number of rotational increments are required to cause the motor 212 to rotate one complete revolution. Moreover, the stepper motor 212 responds by advancing through the rotational increment very rapidly in response to the delivery of each pulse. Consequently, there is very little time latency between the delivery of each pulse to the stepper motor 212 and the increment of rotation achieved by that pulse. The fractional amount of one revolution of the spindle 200 is directly related to the amount of linear advancement of the wire 52 by the spindle 200. By recognizing these relationships, the amount of wire 52 advanced by the spindle 200 is precisely controlled by delivering a predetermined number of pulses to the stepper motor 212 which will result in the advancement of the wire 52 by a linear amount which correlates to the predetermined number of pulses delivered to the stepper motor 212.

For example, if the relationship is such that one pulse to the stepper motor will result in the advancement of the wire by 0.001 inch, the advancement of the wire by ¼ of an inch (0.250 inch) is achieved by applying 250 pulses to the stepper motor. The position of the wire is also achieved in a similar manner. As another example in which one pulse to the stepper motor will result in the advancement of the wire by 0.001 inch, if it is desired to space the bulges 58 apart from one another along the twist pin 50 by an interval 76 (FIG. 1) of 1/10 of an inch (0.100 inch) and the length consumed by each bulge 58 is 2/10 of an inch (0.200 inch), the wire 52 is advanced by 3/10 of an inch to form the sequential bulges by applying 300 pulses to the stepper motor 212.

Because of the relatively rapid response and acceleration characteristics of the stepper motor 212, the stepper motor 212 is capable of advancing the wire 52 very rapidly. Thus, the stepper motor 212 offers the advantages of precise amounts of advancement of the wire 52, precise positioning of the wire 52 during the formation of the bulges 58, and positioning and advancement of the wire on a very rapid basis.

In forming the twist pin 50, the number of pulses delivered to the stepper motor 212 is calculated to correlate to the desired position, the desired amount of advancement and hence the length of the wire 52 into the bulge forming mechanism 106 to create the desired length of the leader 68, to create the desired amount of interval 76 between the bulges 58, and to create the desired length of the tail 72 at the location where the wire 52 is severed after the formation of the twist pin 50. As is discussed below in conjunction with the bulge forming mechanism 106, the delivery of the calculated number of pulses is also timed to coincide with operational states of the bulge forming mechanism 106, thus assuring that the wire is advanced to the calculated extent at the appropriate time to coincide with the proper operational state of the bulge forming mechanism 106. Details concerning the improved bulge forming mechanism 106 and an improved method of fabricating bulges in a helically coiled wire in accordance with the present invention are described below.

As shown in FIGS. 6–10, the bulge forming mechanism 106 comprises a stationary gripping assembly 290, a rotating gripping assembly 292 and a drive motor 294 connected by a timing belt 296 to the rotating gripping assembly 292. The drive motor 294 applies rotational force through the belt 296 to rotate the rotating gripping assembly 292. The wire 52 is advanced from the feed wire mechanism 104 through a stationary clamp member 298 of the stationary gripping assembly 290 and through a rotating clamp member 300 of the rotating clamp assembly 292. The stationary clamp member 298 and the rotating clamp member 300 open approximately simultaneously to allow the wire 52 to be advanced. Both clamp members 298 and 300 thereafter close approximately simultaneously to grip the wire 52.

The stationary clamp member 298 closes around the wire 52 with sufficient force to restrain the wire 52 against rotation. The rotating clamp member 300 also closes around the wire 52 with sufficient force to hold the wire 52 stationary with respect to the rotating clamp member 300. However, because the rotating clamp member 300 is rotating due to the rotational energy applied by the drive motor 294 to the rotating gripping assembly 292, the stationary grip of the wire 52 by the rotating clamp member 300 rotates the wire 52 between the clamping members 298 and 300 in the opposite or anti-helical direction compared to the direction that the strands 54 have been initially wound around the core strand 56 (FIG. 1). As a result of the reverse or anti-helical rotation imparted by the rotating gripping assembly 292, one bulge 58 is formed between the rotating clamp member 300 and the stationary clamp member 298.

After formation of the bulge 58, both clamp members 298 and 300 are again opened, and the wire feed mechanism 104 advances the wire 52 to position the wire at a predetermined position along the length of the wire 52 where the next bulge 58 (FIG. 1) will be formed. The rotating clamp member 300 opens sufficiently wide so that the expanded width of the bulge 58 will pass through the opened rotating clamp member 300.

Figure 8:
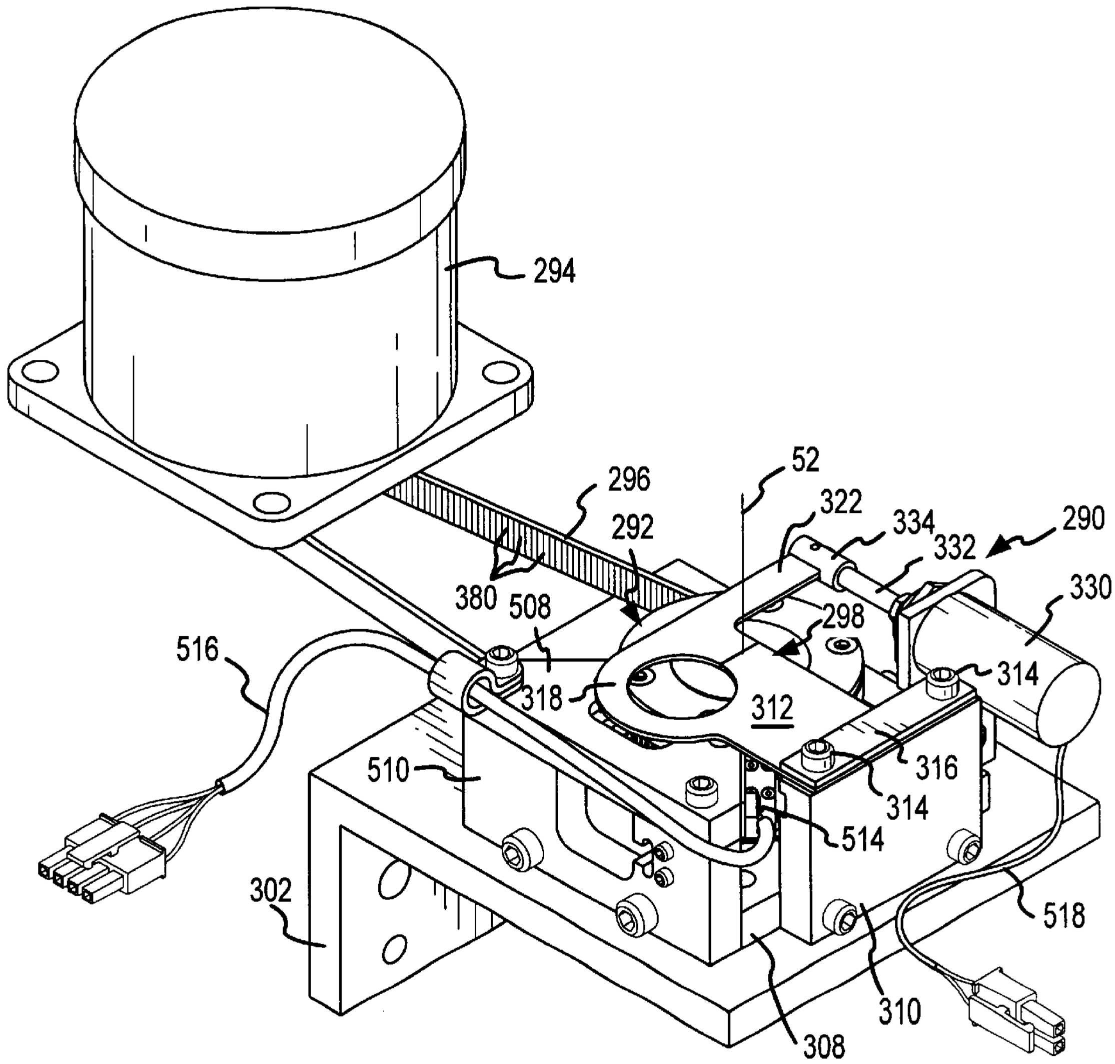
FIG. 8 is an enlarged, perspective view of the bulge forming mechanism shown separated from the other components shown in FIGS. 6 and 7, with certain components not shown for purposes of clarity.
Figure 10:
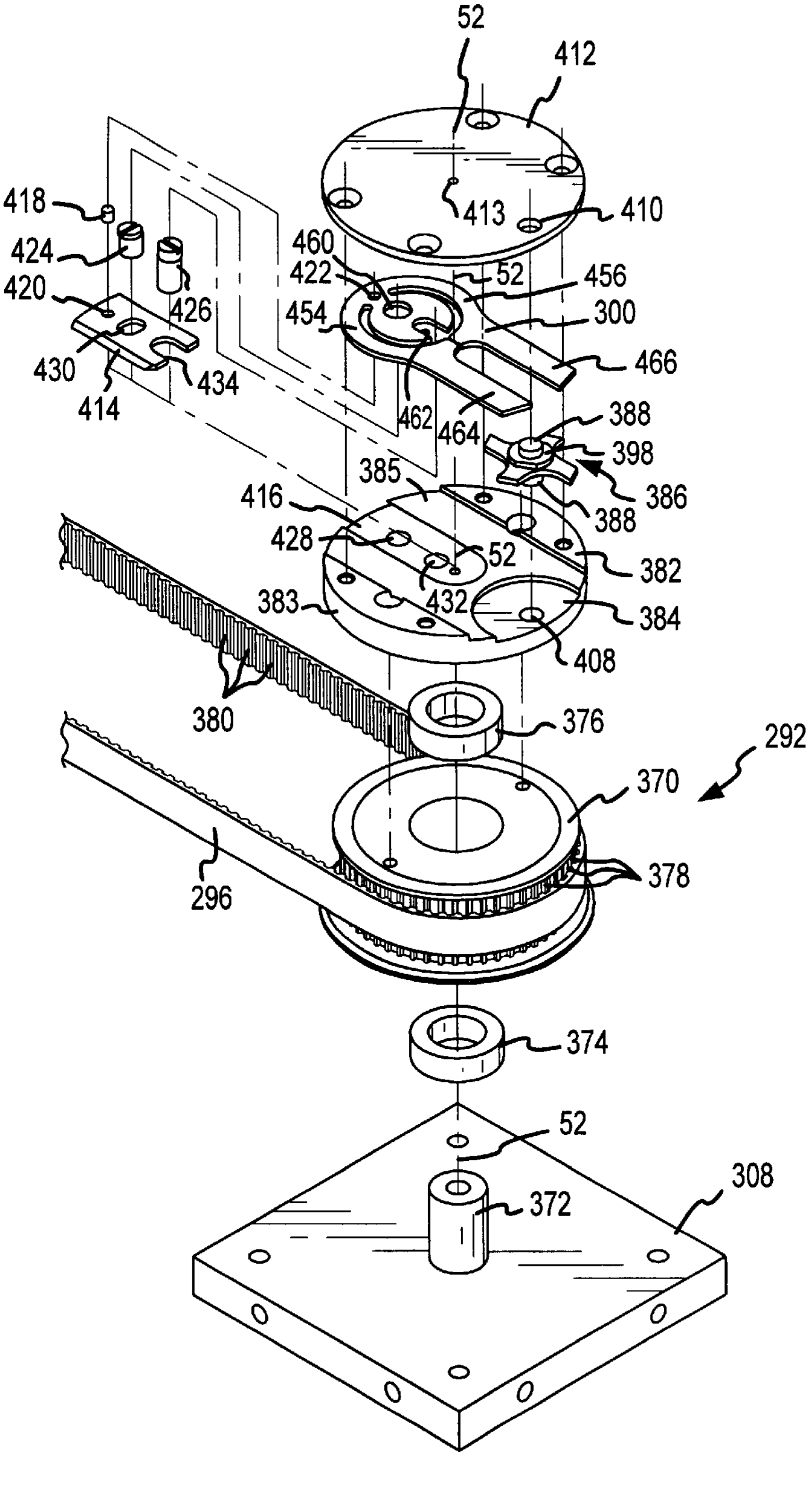
FIG. 10 is an exploded, perspective view of the rotating gripping assembly of the bulge forming mechanism shown in FIG. 9.

As shown in FIG. 8, the rotating gripping assembly 292 is connected to a mounting bracket 302, and the mounting bracket 302 is connected to the support plate 124 of the machine 100 (FIG. 7). The drive motor 294 is connected to a mounting plate 304 which is attached to the support plate 124 by a bracket 306 (FIG. 7). The belt 296 extends through an opening (not shown) in the support plate 124. The rotating gripping assembly 292 is mounted on a base plate 308, and the base plate 308 is connected to the mounting bracket 302. As shown in FIG. 10, all of the components of the rotating gripping assembly 292 are connected directly or indirectly to the base plate 308.

Figure 11:
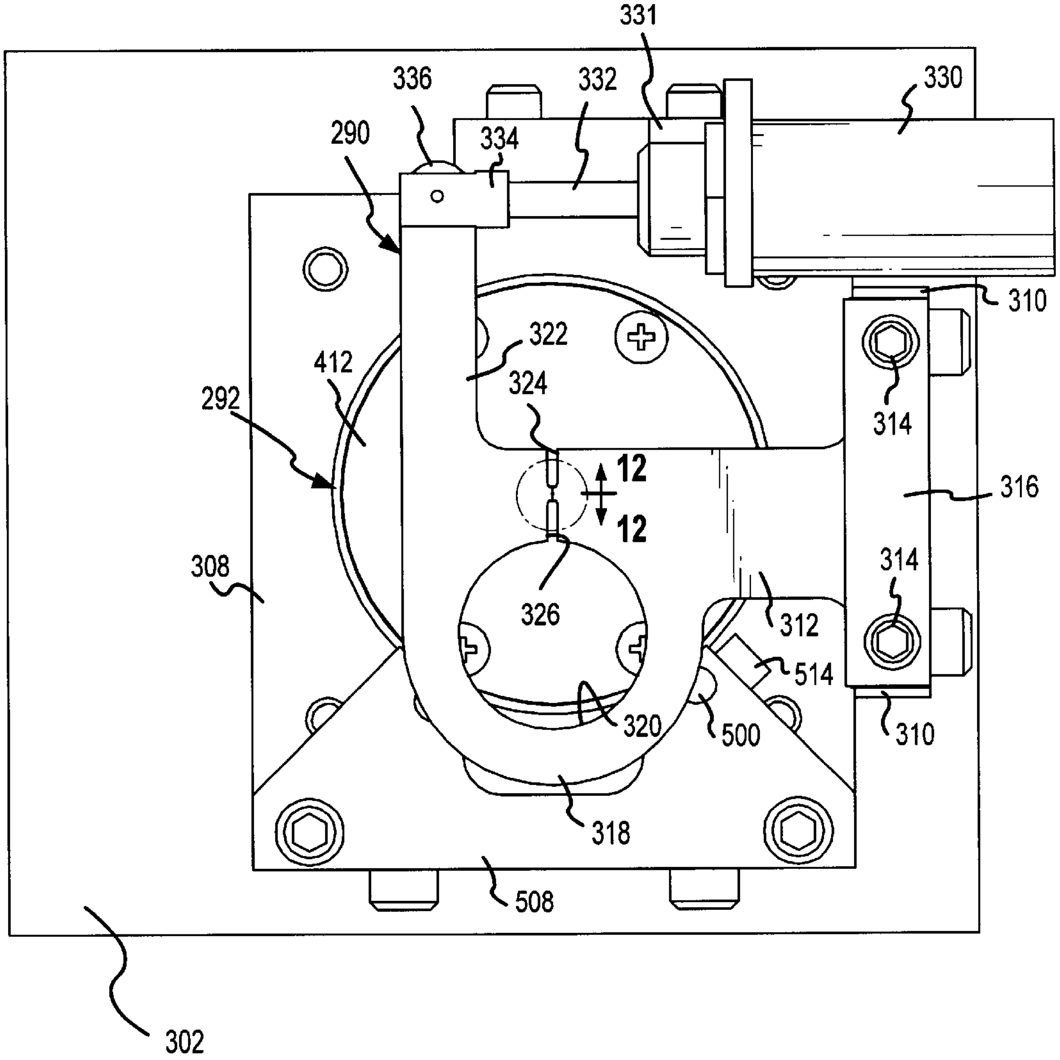
FIG. 11 is an enlarged top plan view of the stationary gripping assembly shown in FIGS. 8 and 9.

The stationary gripping assembly 290 is also connected to the base plate 308 by a mounting block 310, as shown on FIGS. 8 and 11. The stationary clamp member 298 is connected to the mounting block 310. Preferably the stationary clamp member 298 is formed from a relatively thin sheet of spring tempered steel. A base portion 312 of the stationary clamp member 298 is connected by screws 314 and a reinforcing strip 316 to the mounting block 310. As shown in FIG. 11, the base portion 312 is relatively wide and therefore offers considerable torsional resistance to bending or flexing at the location where the stationary clamp member 298 is connected to the mounting block 310. An arcuate portion 318 of the stationary clamp member 298 extends in a semi-circular curve from the base portion 312. The arcuate portion 318 is defined by a cylindrical hole 320 formed through the clamp member 298. An arm portion 322 extends from the arcuate portion 318.

The base portion 312 and the arm portion 322 are separated from one another at a separation which is defined by parting edges 324 and 326 of the base portion 312 and the arm portion 322, respectively. Because of the separation defined by the parting edges 324 and 326, the arm portion 322 is able to pivot slightly inward (clockwise as shown in FIG. 11) to further close the parting edges 324 and 326. The slight inward pivoting movement of the arm portion 322 with respect to the base portion 312 occurs as a result of slightly deflecting the arcuate portion 318. However, the torsional resistance of the arcuate portion 318 tends to resist such slight pivoting movement, and the torsional resistance of the arcuate portion 318 forces the arm portion 322 to return to its original position in which the parting edges 324 and 326 are slightly separated as shown in FIG. 11.

Figure 14:
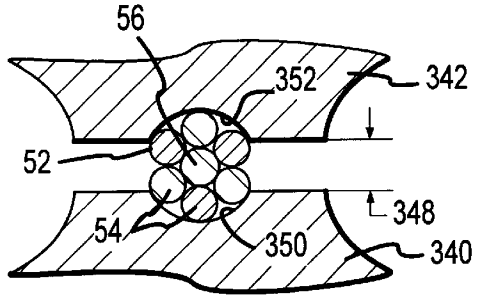
FIG. 14 is an illustration similar to FIG. 12, but illustrating gripping the wire by the jaw members shown in FIG. 12.

A solenoid 330 is connected by a bracket 331 to the base plate 308. A plunger 332 extends from the solenoid 330, and a forward end 334 of the plunger 332 is pivotally connected to an outer end 336 of the arm portion 322. When electrical current this applied to the solenoid 330, the plunger 332 is pulled into the solenoid 330 and applies force on the outer end 336 of the arm portion 322. In response to the force from the solenoid, the arm portion 322 pivots slightly (clockwise as shown in FIG. 11) against the torsional resistance of the arcuate portion 318, and causes the parting edges 324 and 326 to come closer together. The movement of the parting edges 324 and 326 toward one another closes the stationary clamp member 298, to grip the wire 52 (FIG. 14). When electrical current flow to the solenoid 330 is terminated, the torsional resistance of the arcuate portion 318 permits the arm portion 322 to return back to its original position, thereby withdrawing the plunger 332 from within the solenoid 330. When the solenoid 330 does not cause the plunger to pivot the arm portion 322, the gripping surfaces 350 and 352 are separated sufficiently to allow the wire to advance between them (FIG. 15).

Figure 12:
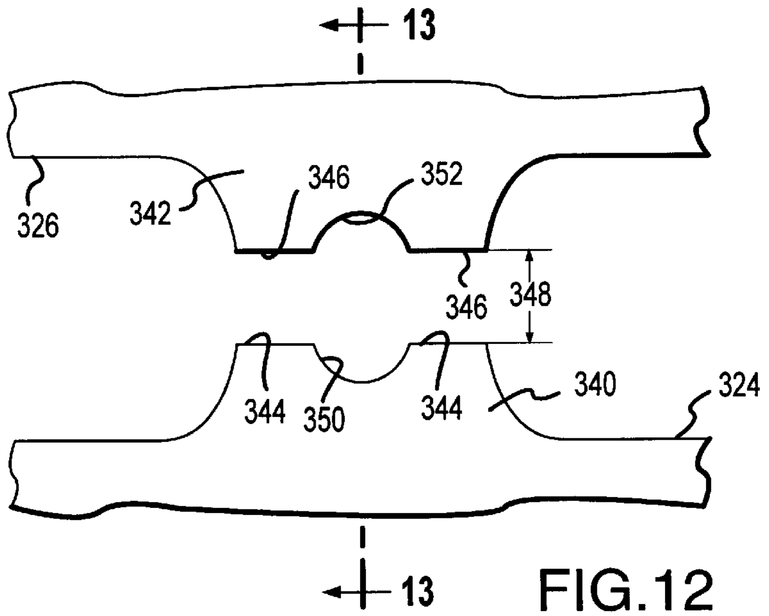
FIG. 12 is an enlargement of that portion of FIG. 11 generally bounded by lines 12—12, illustrating jaw members of a stationary clamp member of the stationary gripping assembly shown in FIG. 11.
Figure 13:
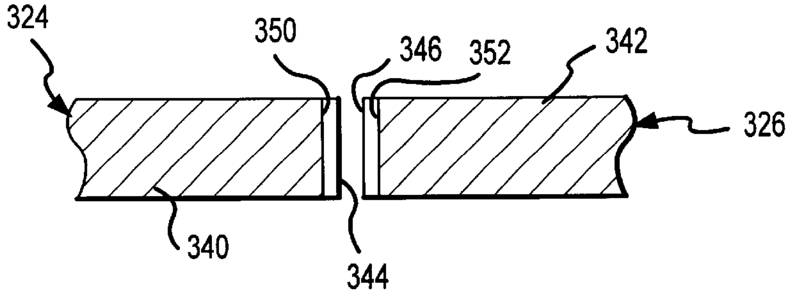
FIG. 13 is a section view taken substantially in the plane of line 13—13 shown in FIG. 12.

Jaw members 340 and 342 are formed on the parting edges 324 and 326, respectively, as shown in FIG. 12. Shoulders 344 and 346 of the jaw members 340 and 342 face each other, but the shoulders 344 and 346 avoid contacting one another by a separation tolerance 348. Semicircular gripping surfaces 350 and 352 are formed in a facing relationship in the shoulders 344 and 346, respectively. The semicircular shape of the gripping surfaces 350 and 352 is established to apply a radial inward force on all of the planetary strands 54, to firmly pinch those planetary strands 54 against the center core strand 56 of the wire 52, as shown in FIG. 14. The force from the solenoid 330 overcomes the torsional resistance characteristics of the arcuate portion 318 of the stationary clamping member 298 to force the jaw members 340 and 342 toward one another (FIG. 14). When the planetary strands 54 are pinched against the core strand 56 as shown in FIG. 14, the separation tolerance 348 is less than before the solenoid 330 was energized (as is understood by comparing the dimension 348 in FIGS. 12 and 14). In some circumstances, the shoulders 344 and 346 may touch one another to reduce the tolerance 348 to zero. As a result of the decreased separation tolerance 348 and the curvature of the gripping surfaces 350 and 352, the amount of gripping force on the wire 52 derived from the solenoid 330 is sufficient to prevent the wire from slipping in rotation around the gripping surfaces 350 and 352 when the bulge 58 is formed from the rotation of the rotating gripping assembly 292.

Figure 15:
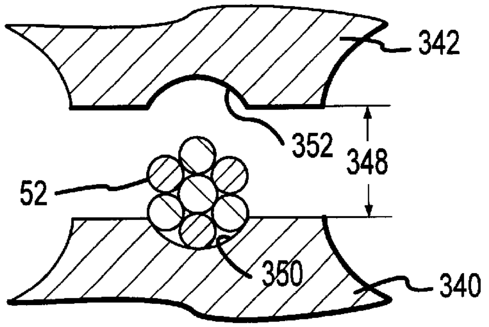
FIG. 15 is an illustration similar to FIG. 14, but illustrating releasing the wire by the jaw members shown in FIG. 12.

When the solenoid 330 is not activated, the jaw members 340 and 342 move away from one another and thereby open the stationary clamp member 298, and the amount of the separation tolerance 348 returns to normal as shown in FIGS. 12 and 15. The normal amount of tolerance 348 as shown in FIG. 15 offers sufficient clearance to allow the wire 52 to advance without excessive dragging. However, because the jaw member 340 is part of the stationary base portion 312 of the stationary clamp member 298, the gripping surface 350 does not move as does the gripping surface 352 on the jaw member 342. The gripping surface 350 is also positioned in direct coaxial alignment with the location where the wire is fed from the wire feed mechanism. Consequently, as the wire 52 is advanced while the stationary clamp member 298 is open (FIG. 15) the wire 52 lightly contacts the jaw member 340 at its gripping surface 350. This contact establishes electrical potential reference on the wire which is used by the wire feed mechanism 104 in connection with the contact bars 178 and 180 (FIG. 7) to control the formation of the S-shaped configuration in the manner described above.

The size of the gripping surfaces 350 and 352 must be adjusted to accommodate different sizes of wire 52. The wire size adjustment is accomplished by replacing the stationary clamp member 298 with a similar clamp member 298 having different sized gripping surfaces 350 and 352. The semicircular gripping surface 350 of the stationary clamp member 298 should be aligned very precisely in a coaxial position with respect to the center line of the wire 52 advanced from the wire feed mechanism 104 and the rotational center of the rotating gripping assembly 292. Otherwise, the bulges 58 formed by the rotating gripping assembly 292 will be laterally displaced from the axis of the wire 52, the bulges may be non-symmetrical, and the fabricated twist pin may be slightly bent. Laterally displaced and non-symmetrical bulges and slight bends in the twist pin can cause problems when transporting the fabricated twist pins through the inductor mechanism 108 and into the twist pin receiving mechanism 114 (FIG. 6). The position of the gripping surfaces 350 and 352 relative to the rotational center of the bulge forming mechanism 106 is adjusted by loosening the screws 314 (FIG. 9) and adjusting the position of the stationary clamp member 298 on the mounting block 310 until the gripping surfaces 350 and 352 are precisely located, at which time the screws 314 may be tightened.

The stationary clamp member 298 is preferably formed from a sheet of conventional spring tempered steel. The size and configuration of the jaw members 340 and 342, the shoulders 344 and 346, and the gripping surfaces 350 and 352 are established by conventional electrical discharge machining (EDM).

Figure 9:
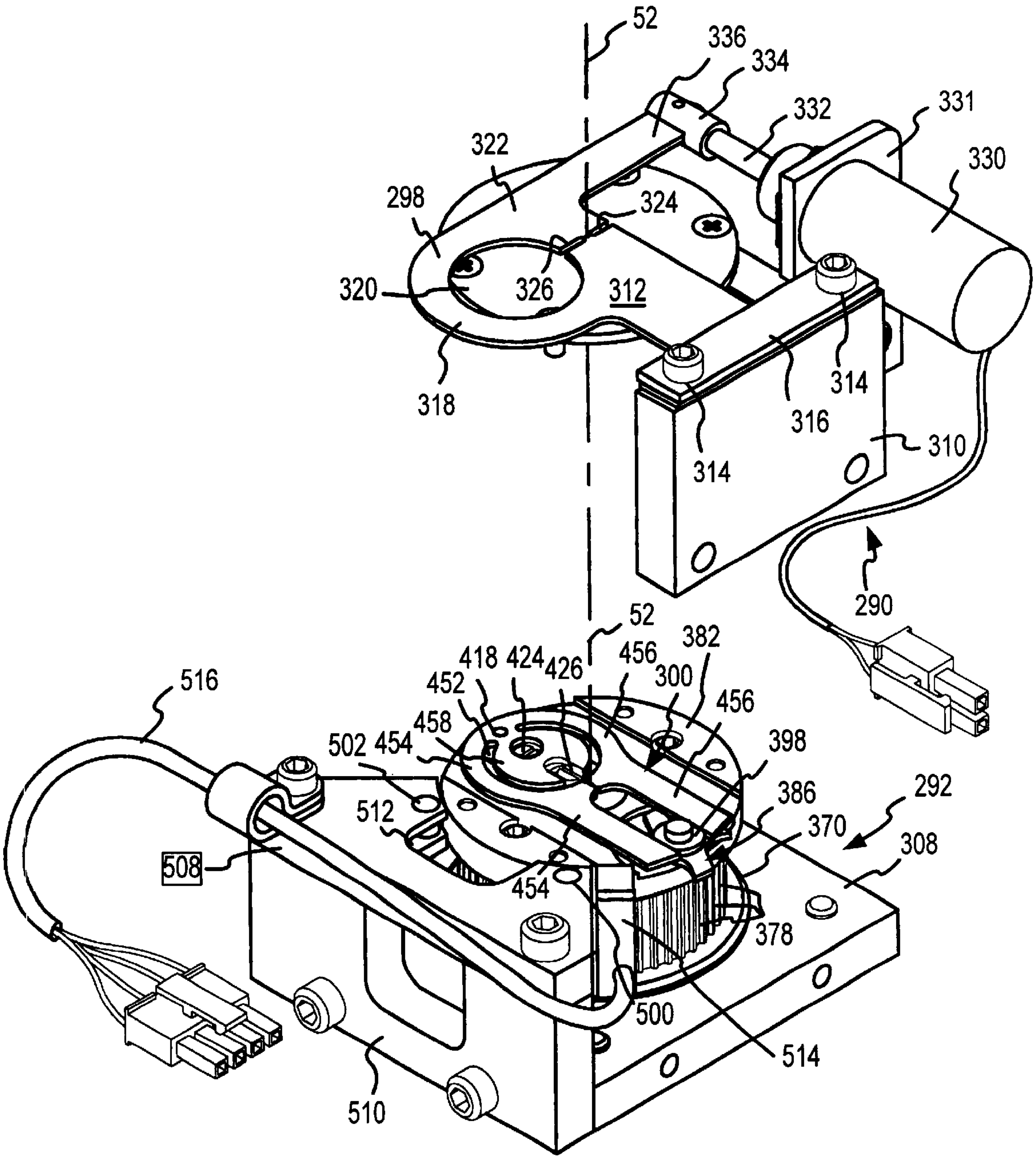
FIG. 9 is an enlarged, exploded perspective view of a stationary gripping assembly and a rotating gripping assembly of the bulge forming mechanism shown in FIG. 8.

As shown in FIGS. 9 and 10, a pulley wheel 370 forms the foundational rotational component of the rotating gripping assembly 292. The pulley wheel 370 is connected by bearings 374 and 376 to a post 372 which extends from the base plate 308. The outer circumference of the pulley wheel 370 is configured with teeth 378 which mesh with corresponding teeth 380 of the timing belt 296. Of course, a similar toothed pulley wheel (not shown) is connected to the drive motor 294 (FIG. 8) and the teeth of that other tooth pulley also mesh with the teeth 380 of the belt 296 to rotate the pulley wheel 370. The drive motor 294 is a conventional stepper motor. The number and frequency of pulses delivered to the stepper drive motor 294 control its rotational position and rotational rate in a conventional manner. The use of the toothed timing belt 296 to rotate the pulley wheel 370 permits precise control over the rotational rate and position of the pulley wheel 370 and the other elements of the rotating gripping assembly 292 carried by the pulley wheel 370.

Figure 16:
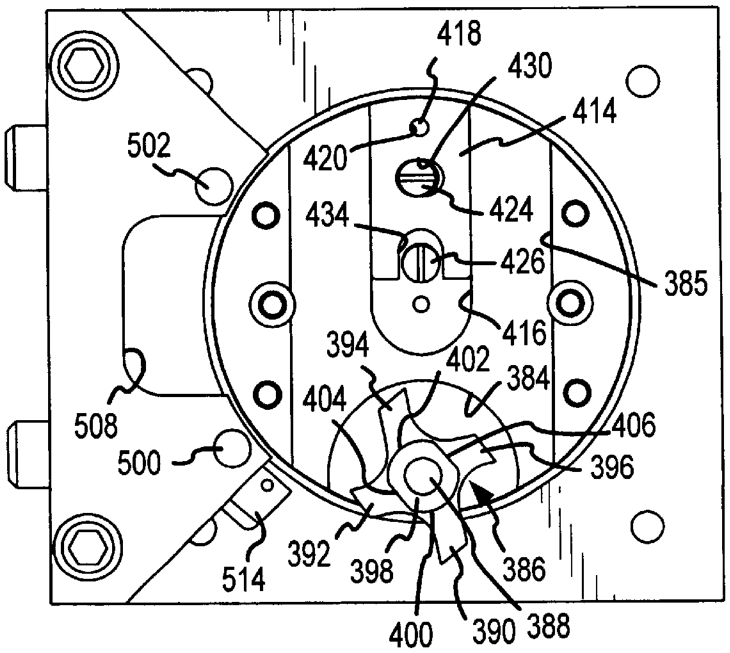
FIG. 16 is a top plan view of the rotating gripping assembly shown in FIG. 9 and other portions of the bulge forming mechanism, with a rotating clamp member of the rotating gripping assembly removed for purposes of illustration.

A carrier disk 382 is attached to the upper surface of the pulley wheel 370 by screws (not shown). An outside peripheral or circumferential edge 383 of the carrier disk 382 extends slightly beyond the periphery of the teeth 378 to form a ridge for confining the belt 296 to the pulley wheel 370. A relatively wide rectangular groove 385 extends completely diametrically across the carrier disk 382, as is also shown in FIG. 16. The rotating clamp member 300 and its associated components are located within the groove 385. A semicircular recess 384 is formed in the groove 385 adjacent to the peripheral edge of the carrier disk 382. A cam wheel 386 is positioned within the recess 384. The cam wheel 386 includes a center shaft 388 from which four outwardly protruding actuating arms 390, 392, 394 and 396 extend. As shown in FIG. 16, the actuating arms 390, 392, 394 and 396 extend at 90 degree rotational intervals from one another around the center shaft 388.

A cam member 398 is attached to the actuating arms 390–396 surrounding the center shaft 388. The cam member 398 has a first curved surface 400 which is generally radially aligned with the first actuating arm 390. On the diametrically opposite side of the cam member 398, a second curved surface 402 is generally radially aligned with the second actuating arm 394. The curved surfaces 400 and 402 each have an arcuate shape that extends at the same radial distance from the axial center of the center shaft 388. First and second flat surfaces 404 and 406, respectively are also formed on the cam member 398. The flat surfaces 404 and 406 extend tangentially with respect to a diametric reference extending through the axial center of the center shaft 388. The first flat surface 404 is generally radially aligned with the second actuating arm 392, and a second flat surface 406 is generally radially aligned with the fourth actuating arm 396.

Figure 17:
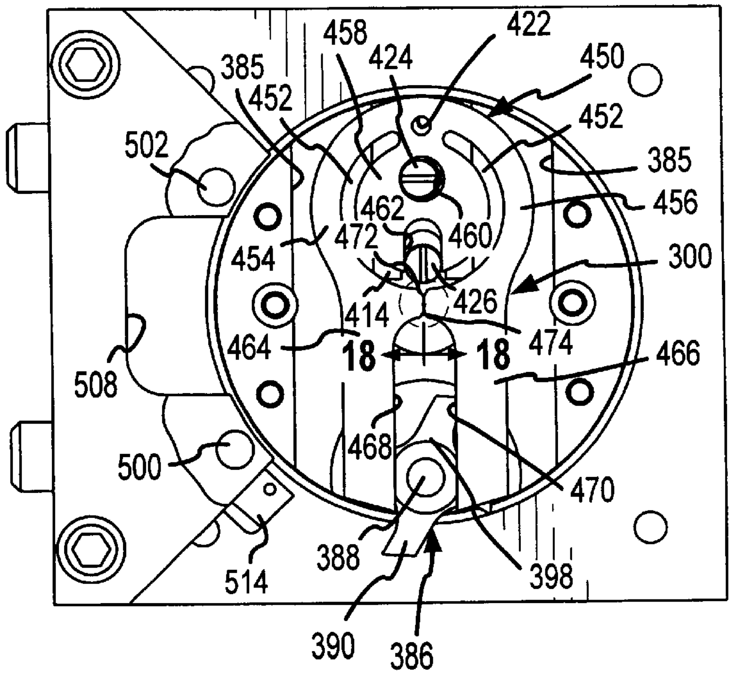
FIG. 17 is a top plan view similar to that shown in FIG. 10, but including the rotating clamp member of the rotating gripping assembly, with portions broken away for purposes of illustration.

The bottom end of the center shaft 388 fits within a cylindrical hole 408 formed in the carrier disk 382, as shown in FIG. 10. With the bottom end of the center shaft 388 in the hole 408, the cam wheel 386 is able to rotate relative to the carrier disk 382. The circumference of the recess 384 is slightly beyond the outer extremities of the actuating arms 390–396 to allow the actuating arms 390–396 to rotate freely within the recess 384 without contacting any portion of the carrier disk 382. However, because the hole 408 and the center shaft 388 are positioned closely adjacent to the outer circumferential edge of the carrier disk 382, the actuating arms 390–396 are able to rotate into a position in which one of the actuating arms 390–396 extends radially outward beyond the outer peripheral edge 383 of the carrier disk 382, as shown in FIGS. 9,16 and 17.

The upper end of the center shaft 388 extends into a similarly shaped circumferential hole 410 formed in a cover plate 412, as shown in FIG. 10. The cover plate 412 is attached to the carrier disk 382 by screws (not shown). In addition to covering the cam wheel 386 and supporting the upper end of its center shaft 388, the cover 412 also covers the rotating clamp member 300 and elements which connect it to the carrier disk 382. A hole 413 is formed in the center of the cover plate 412. The wire 52 is delivered to the rotating gripping assembly 292 through the hole 413.

The rotating clamp member 300 is connected to the carrier disk 382 by a slide member 414 which fits within a radially extending slot 416 of the rectangular groove 385, as shown in FIGS. 10 and 16. The slot 416 extends radially outward on one side of the carrier disk 382 at a generally diametrically opposite location from the location where the recess 384 extends radially outward on the opposite side of the carrier disk 382. A pin 418 fits within a hole 420 of the slide member 414. The pin 418 also fits within a hole 422 (FIG. 10) of the rotating clamp member 300 to hold the rotating clamp member 300 on the carrier disk 382.

The position of the slide member 414 on the carrier disk 382, and hence the position of the rotating clamp member 300 on the carrier disk 382, is adjusted by eccentric pins 424 and 426. A cylindrical shaft bottom portion of the eccentric pin 424 fits within a cylindrical hole 428 formed in the carrier disk 382 in the slot 416. A top end portion of the pin 424 fits within a hole 430 formed in the slide member 414. The top end portion of the pin 424 is eccentrically-positioned with respect to the cylindrical shaft bottom portion of the pin 424. Consequently, rotating the pin 424 with a screwdriver inserted in at a slot formed in the top end portion of the pin 424 adjusts the radial position of the slide member 414 within the slot 416.

In a similar manner, a lower cylindrical shaft portion of the eccentric pin 426 fits within a cylindrical hole 432 in the carrier disk 382. A top portion of the eccentric pin 426 is eccentrically-positioned with respect to the lower shaft portion. The upper portion of the eccentric pin 426 passes through a slot 434 formed in an inner end of the slide member 414. Rotation of the eccentric pin 426 with a screwdriver placed in the slot in its upper portion causes the slide member 414 to pivot about the eccentric pin 424, thereby adjusting the circumferential or tangential position of the pin 418 extending from the slide member 414.

The rotating clamp member 300 is formed from a flat piece of resilient spring tempered steel. The clamp member 300 includes a generally circular end portion 450 into which a circular slot 452 has been formed to create two arcuate portions 454 and 456, as shown in FIGS. 10 and 17. The arcuate portions 454 and 456 extend from a position near the hole 422 into which the pin 418 from the slide member 414 extends. The circular slot 452 also defines an inner circular portion 458 into which a hole 460 and a slot 462 are formed. The hole 460 and the slot 462 are positioned above the eccentric pins 424 and 426, respectively. The holes 460 and the slot 462 permit a screwdriver to be inserted into the slots of the eccentric pins 424 and 426, to rotate the pins and adjust the position of the rotating clamp member 300 on the carrier disk 382 as previously described.

Lever arm portions 464 and 466 extend from the arcuate portions 454 and 456, respectively, in a generally parallel, bifurcated manner. Inner edges 468 and 470 of the lever arm portions 464 and 466, respectively, are positioned on opposite sides of the cam member 398 of the cam wheel 386. The lever arm portions 464 and 466 are separated from one another near the center of the rotating clamp member 300 at parting edges 472 and 474. The parting edges 472 and 474 face one another, and the wire 52 extends between the parting edges 472 and 474.

Figure 18:
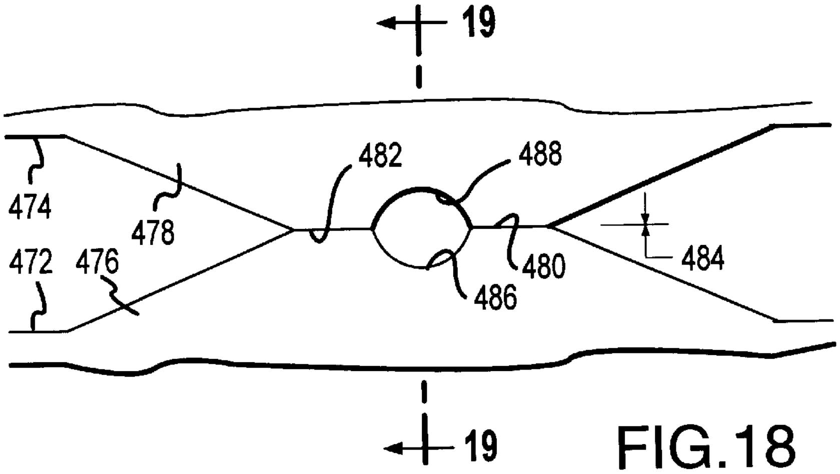
FIG. 18 is an enlargement of a portion of FIG. 17 bounded by lines 18—18, illustrating jaw members of a rotating clamp member of the rotating gripping assembly shown in FIG. 17.
Figure 19:
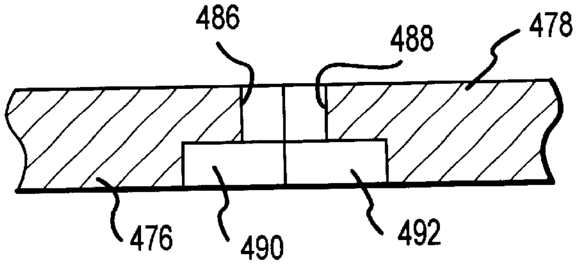
FIG. 19 is a section view taken substantially in the plane of line 19—19 shown in FIG. 18.

Jaw members 476 and 478 are formed on the parting edges 472 and 474 as shown in FIG. 18. Shoulders 480 and 482 of the jaw members 476 and 478 face each other and normally contact each other thereby causing a separation tolerance 484 between the shoulders 480 and 482 to be very slight or non-existent. Crescent shaped gripping surfaces 486 and 488 are formed in a facing relationship in the shoulders 480 and 482, respectively. The jaw members 476 and 478 are undercut in the areas 490 and 492 below the crescent shaped gripping surfaces 486 and 488, respectively, to reduce the vertical area of the gripping surfaces 486 and 488, as shown in FIG. 19. The reduced vertical area of the gripping surfaces 486 and 488 concentrates the force applied by the gripping surfaces 486 and 488 on the wire.

Figure 20:
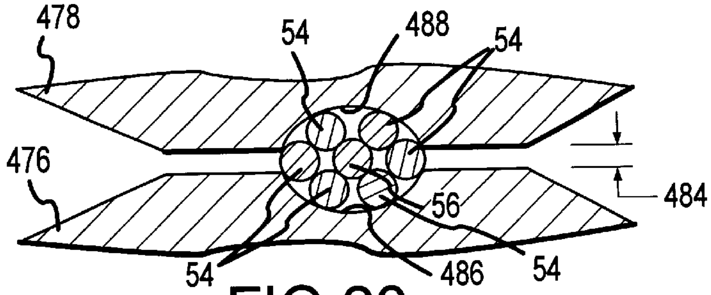
FIG. 20 is an illustration similar to FIG. 19, but illustrating gripping the wire by the jaw members shown in FIG. 18.

The crescent shape of the gripping surfaces 486 and 488 pushes the strands 54 and 56 of the wire 52 into an oval configuration as shown in FIG. 20, when the wire is gripped. The oval configuration of the strands 54 and 56 creates a non-uniform radial dimension (greater horizontally, as shown in FIG. 20) to the configuration of the strands 54 and 56 when they are pinched together by the gripping surfaces 486 and 488. The non-uniform radial dimension of the oval configuration permits the gripping surfaces 486 and 488 to apply more torque to the wire while untwisting the strands 56 to form the bulge 58 (FIG. 1). The oval configuration of the strands 54 and 56 is more effective in resisting rotational slippage when the bulge is created than a circular configuration of the gripping surfaces which has a uniform radial configuration.

In general, the crescent shaped curvature of the gripping surfaces 486 and 488 should create a football shape surrounding the wire when it is gripped (FIG. 20). The maximum width between the gripping surfaces 486 and 488 when no wire is present between them (FIG. 18) should be approximately one-half of the distance from the more pointed, displaced ends. Of course, the size of the gripping surfaces 486 and 488 must be adjusted to accommodate different sizes of wire 52. The wire size adjustment is accomplished by replacing the rotating clamp member 300 with a similar clamp member 300 having different sized gripping surfaces 486 and 488. The rotating clamp member 300 is preferably formed from a sheet of conventional spring tempered steel. The configuration of the jaw members 476 and 478, the shoulders 480 and 482, and the gripping surfaces 486 and 488 is formed by conventional electrical discharge machining (EDM).

The gripping surfaces 486 and 488 should be aligned in a coaxial position with respect to the center line of the wire 52 in the rotating gripping assembly 292 and from the wire feed mechanism 104. Otherwise, the bulges 58 formed will be laterally displaced from the axis of the wire 52 and may also be non-symmetrical, or a slight bend in the wire will be induced so that the twist pin will be bent out of coaxial alignment. Laterally displaced and non-symmetrical bulges, and twist pins which are slightly bent out of coaxial alignment, may cause delivery problems when transporting the fabricated twist pins through the inductor mechanism 108 and into the twist pin receiving mechanism 114, as well as insertion problems when the twist pin is inserted through the printed circuit boards of the module.

The torsional force characteristics of the arcuate portions 454 and 456 of the rotating clamp member 300 force the jaw members 476 and 478 toward one another. When the strands 54 and 56 of the wire 52 are pinched as shown in FIG. 20, the separation tolerance 484 is greater than would occur under circumstances where no wire is pinched between the gripping surfaces 486 and 488, as is understood by comparing FIGS. 18 and 20. As a result of the increased separation tolerance 484 and the crescent shaped curvature of the gripping surfaces 486 and 488 and their reduced vertical surface area (FIG. 19), the amount of torque applied by the arcuate portions 454 and 456 to the jaw members 476 and 478 is sufficient to grip the wire so that the rotating gripping assembly 292 can untwist the strands in the anti-helical direction to form the bulge 58 (FIG. 1).

The rotating clamp member 300 develops the pinching force from the resiliency of the spring tempered steel from which the clamp member 300 is formed. The resiliency of the material of the arcuate portions 452 and 454 causes force which biases the lever arm portions 464 and 466 toward one another, thereby pinching the strands 54 and 56 of wire between the gripping surfaces 486 and 488. Under such conditions, the flat surfaces 404 and 406 of the cam member 398 are located adjacent to and extend generally parallel to the inner edges 468 and 470 of the lever arm portions 464 and 466, as shown in FIG. 17. A slight tolerance between the flat surfaces 404 and 406 and the adjoining inner edges 468 and 470 is typical when the wire is pinched between the gripping surfaces 486 and 488, as shown in FIG. 19. When there is no wire pinched between the gripping surfaces 486 and 488, the inner edges 468 and 470 will typically contact the flat surfaces 404 and 406.

Figure 21:
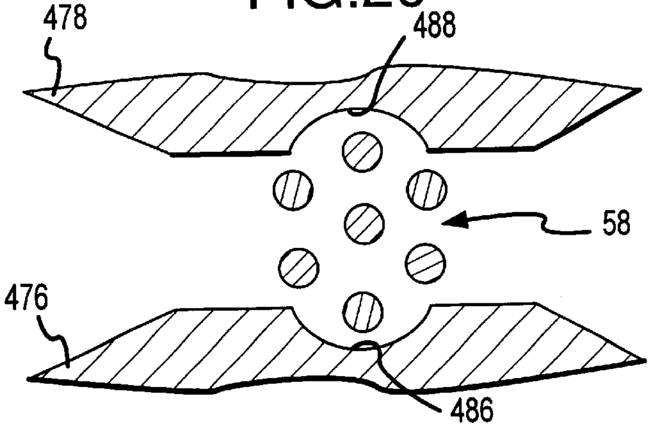
FIG. 21 is an illustration similar to FIG. 20, but illustrating releasing the wire by the jaw members shown in FIG. 18.
Figure 23:
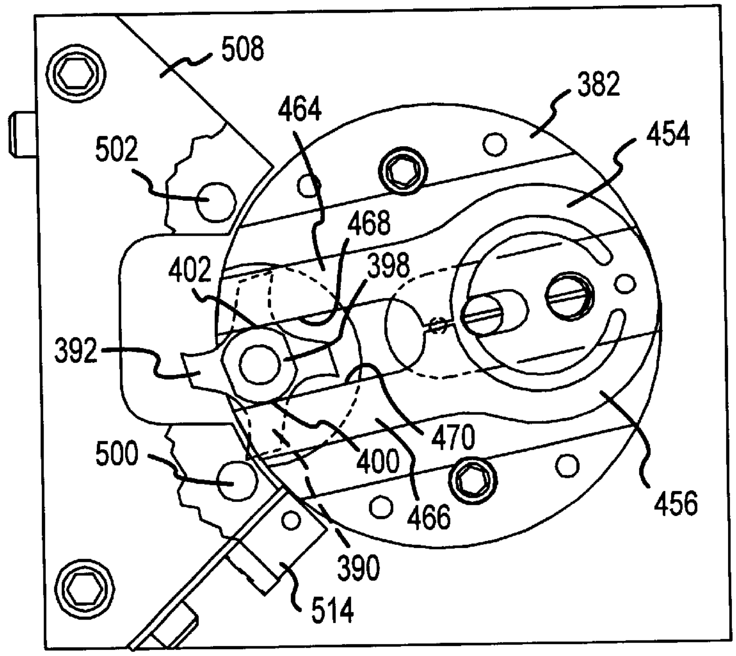

To separate the gripping surfaces 486 and 488, the cam wheel 386 must be rotated to position the curved surfaces 400 and 402 of the cam member 398 into contact with the inner edges 468 and 470 of the lever arm portions 464 and 466. This condition is illustrated in FIG. 23. The curved surfaces 400 and 402 force the lever arm portions 464 and 466 apart to separate the gripping surfaces 486 and 488 and release the wire 52 located between those gripping surfaces. Moreover, the separation of the gripping surfaces 486 and 488 is sufficient to permit a bulge 58 to pass between the separated gripping surfaces 486 and 488 as the wire is advanced after the formation of the bulge, as shown in FIG. 21.

Figure 22:
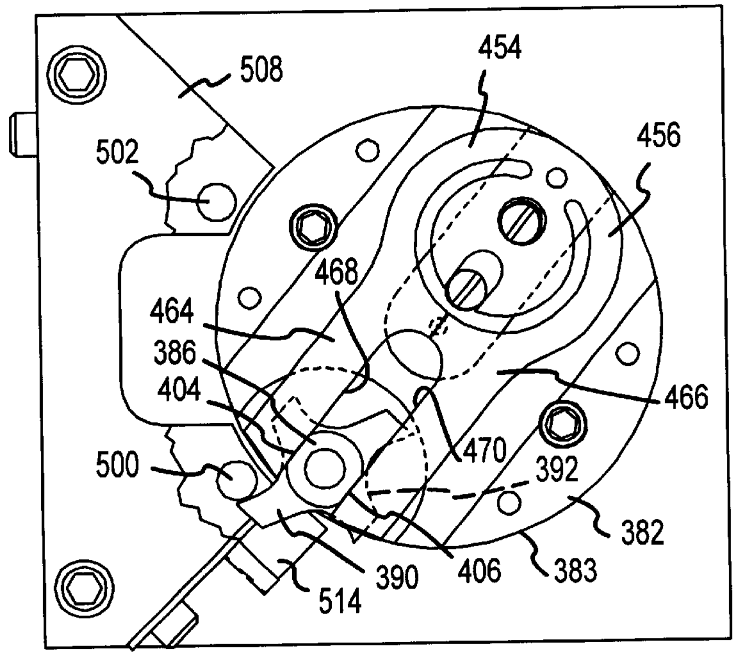
FIGS. 22–24 are illustrations of portions of the rotating gripping assembly shown in FIGS. 8, 9, and 17, illustrating sequential operation while forming a bulge of the twist pin shown in FIG. 1.
Figure 24:
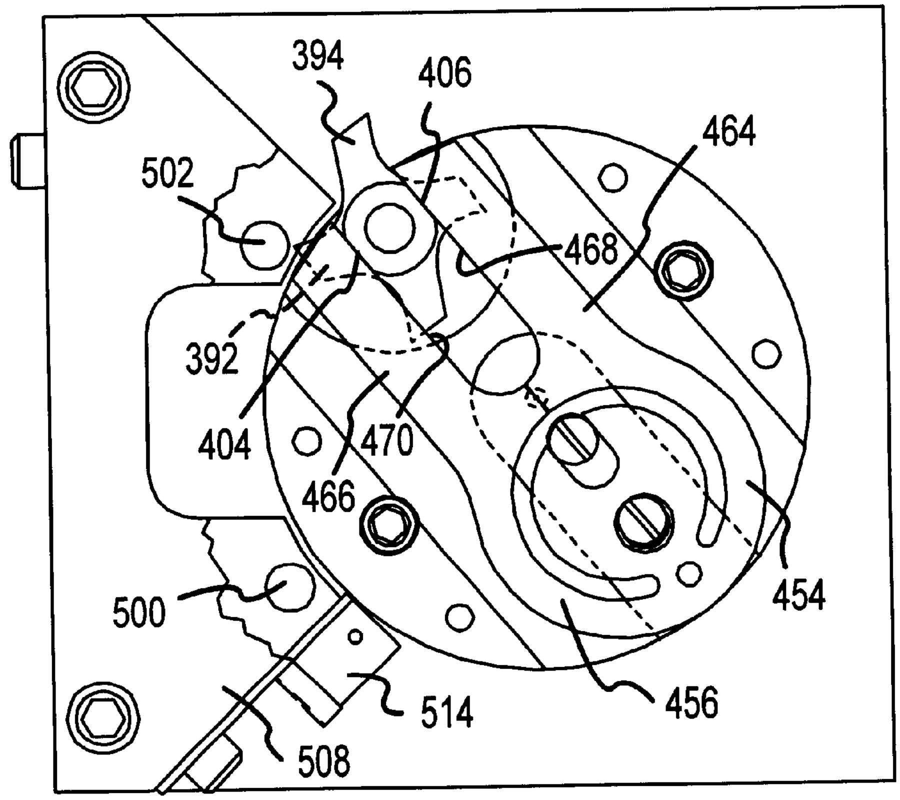

The cam wheel 386 is rotated as a result of the actuating arms 390, 392, 394 and 396 contacting trip pins 500 and 502, as illustrated in FIGS. 22–24. The trip pins 500 and 502 are positioned in holes 504 and 506, respectively, of a yoke member 508, as shown in FIGS. 9, 16, 17 and 22–24. The yoke member 508 is connected to a riser member 510, and the riser member 510 is connected to the base plate 308 (FIG. 9). The trip pins 500 and 502 are positioned radially adjacent to the outer circumferential edge 383 of the carrier disk 382. The rotating carrier disk 382 moves the cam wheel 386 in a circular path to contact the outwardly extending one of actuating arms 390–396 with the trip pins 500 and 502. When a radially outward extending actuating arm 390–396 comes into contact with a trip pin 500 or 502, the continued rotation of the carrier disk 382 causes the cam wheel 386 to rotate about its center shaft 388 by one-fourth of a complete revolution. The radially outward extending actuating arm rotates rearwardly with respect to the direction of rotation of the carrier disk 382 into a position extending somewhat tangentially to the outside peripheral edge 383 of the carrier disk 382, while the next actuating arm rotates into a position extending radially outward so that it will contact the next trip pin encountered. In this manner, each time an actuating arm contacts one of the trip pins 500 and 502, the cam wheel 386 is rotated another one-fourth of a complete revolution.

A slot 512 (FIG. 9) extends through the yoke member 508 to permit the actuating arms 390–396 to rotate and to pass through the yoke member 508 without contacting any part of the yoke member 508 other than the trip pins 500 and 502. The trip pins 500 and 502 are located at a 90 degree relative rotational displacement from one another, as a shown in FIGS. 16, 17 and 22–24. The rotation of the cam wheel 386 is caused by the sequence of the actuating arm 390 contacting the trip pin 500 followed by the actuating arm 392 contacting the trip pin 502 during one revolution of the rotating gripping assembly 292, followed in the next revolution of the rotating gripping assembly by the actuating arm 394 contacting the trip pin 500 followed by the actuating arm 396 contacting the trip pin 502. The rotation of the cam wheel 386 as a result of these actuating arms contacting these trip pins causes the rotating clamp member 300 to grip the wire 52 during three-fourths or 270 degrees of one complete revolution of the rotating gripping assembly 292 (when rotating clockwise as shown in FIGS. 24 and 22 from pin 502 around to pin 500) and to release the wire 52 during one-fourth or 90 degrees of one complete revolution of the rotating gripping assembly 292 (when rotating clockwise as shown in FIG. 23 from pin 500 to pin 502). The bulge 58 (FIG. 1) is formed during the 270 degree rotation of the rotating gripping assembly. The grip on the wire is released by the rotating gripping assembly 292 and the wire is advanced by the wire feed mechanism 104 during the 90 degrees of rotation. This gripping and rotating action of the rotating gripping assembly 292, to form the bulge 58, is illustrated in FIGS. 22–24.

As shown in FIG. 22, the first actuator arm 390 is extending radially outward beyond the circumferential edge 383 of the carrier disk 382. The first flat surface 404 of the cam member 398 is adjacent and parallel to the inner edge 468 of the lever arm portion 464, and the second flat surface 406 is adjacent and parallel to the inner edge 470 of the lever arm portion 466. The first actuating arm 390 is about to contact the trip pin 500, due to the clockwise (as shown) rotation of the carrier disk 382. The function of the trip pin 500 is to rotate the cam wheel 386 to cause the rotating clamp member 300 to open and release the grip on the wire 52. As the disk carrier 382 rotates the cam wheel 386 past the opening trip pin 500, the cam wheel 386 rotates counterclockwise (as shown) to extend the first actuating arm 390 in a rearward direction (relative to the clockwise rotational direction of the carrier disk 382 as shown) and to extend the second actuating arm 392 radially outward, as shown in FIG. 23.

In the rotational condition shown in FIG. 23, the cam member 398 has been rotated to position the second curved surface 402 in contact with the inner edge 468 of the lever arm portion 464, and the first curved surface 400 has been positioned in contact with the inner edge 470 of the lever arm portion 466. The curved surfaces 400 and 402 force the lever arm portions 464 and 466 apart, thereby increasing the distance between the gripping surfaces 486 and 488 to release the wire. The separation of the gripping surfaces 486 and 488 and the release of the wire is shown in FIGS. 21 and 23. Thus, the opening trip pin 500 causes the rotating clamp member 300 to release the grip on the wire when the carrier disk 382 rotates the cam wheel 386 into adjacency with the opening trip pin 500.

After the wire has been released, which is the condition shown in FIGS. 21 and 23, the wire 52 remains released while the carrier member 382 rotates until the second actuating arm 392 comes in contact with the trip pin 502. The continued rotation of the carrier disk 382 with the second actuating arm 392 in contact with the trip pin 502 causes the cam wheel 386 to rotate one-fourth of a revolution in the counterclockwise direction, as shown in FIG. 24. The second actuating arm 392 pivots rearwardly into a tangential position with respect to the outer circumferential edge 383 and the third actuating arm 394 extends radially outward. With the third actuating arm 394 extending radially outward, the second flat surface 406 is adjacent to the inner edge 468 of the lever arm portion 464, and the first flat surface 404 is adjacent to the inner edge 470 of the lever arm portion 464. In this condition, the lever arm portions 464 and 466 are biased toward one another, causing the gripping surfaces 486 and 488 to again grip the wire 52 as shown in FIG. 20. Thus, the trip pin 502 causes the cam wheel 386 to rotate into a position where the rotating clamp member 300 grips the wire, as shown in FIG. 24.

The rotating gripping assembly 292 rotates 270 degrees or three-fourths of a revolution from the position shown in FIG. 24 to the position shown in FIG. 22, and the sequence of events illustrated in FIGS. 22–24 thereafter repeats itself, except that the sequence starts with the third actuating arm 394 contacting the opening trip pin 500 and the fourth actuating arm 396 contacting the closing trip pin 502. Because of the symmetric configuration of the cam wheel 386, there is a relative reversal of the positions of the curved surfaces 400 and 402 and the flat surfaces 404 and 406 relative to the inner edges 368 and 370 of the lever arm portions 464 and 466 during subsequent revolutions of the carrier disk 382. This reversal of relative positional relationships occurs with every subsequent rotation of the carrier disk 382 because the cam wheel 386 makes one revolution for each two complete revolutions of the carrier disk 382. Nevertheless, because of the symmetric relationship of the cam wheel 386, the same operation occurs with each revolution of the rotating gripping assembly 292.

The closed, gripping condition of the clamp member 300 is maintained during the 270 degrees of rotation of the cam wheel 386 from the closing trip pin 502 (position shown in FIG. 24) to the opening trip pin 500 (position shown in FIG. 22). During this 270 degree rotational interval, the bulge is formed as a result of gripping the wire and rotating the gripped wire in the anti-helical direction due to rotation of the rotating gripping assembly 292. The ability to untwist the strands in the anti-helical direction in a single 270 degree rotational interval is a considerable improvement over prior devices which could only untwist the strands for less than 180 rotational degrees. As a result of the present improvements, the bulge forming mechanism 106 is capable of making one bulge with a single rotation of the rotating gripping assembly 292, compared to the requirements of prior devices to grip, twist and release the wire at the location of the bulge two times in order to fully develop the bulge.

During rotation of the cam wheel 386 from the opening trip pin 500 (the position shown in FIG. 22) to the closing trip pin 502 (the position shown in FIG. 24), the wire 52 is released and the gripping surfaces 486 and 488 of the jaw members 476 and 478 of the rotating clamp member 300 are opened (FIG. 21). During the time occupied in rotating the rotating gripping assembly 292 through the open interval of 90 rotational degrees, the stationary and rotating clamp members 298 and 300 must be opened approximately simultaneously. Opening the stationary clamp member 298 is accomplished by de-energizing the solenoid 330 (FIGS. 8, 9, 11) of the stationary gripping assembly 290, as previously described.

To coordinate the application of electrical energy to the solenoid 330 with the mechanical opening of the rotating clamp member 300, an opening sensor 514 (FIGS. 8, 9,16, 17, 22–24) is attached to the yoke member 508 at a position to sense the presence of the actuating arms 390 or 394 making contact with the opening trip pin 500. Preferably the opening sensor 514 is a photoelectric sensor which delivers a trigger signal on a cable 516 (FIGS. 8 and 9) to the controller (not shown) of the machine 100. The machine controller responds to the trigger signal to control the delivery of electrical energy to the solenoid 330 through an electrical cable 518 (FIG. 8) and to activate the precision feed motor 212 to rotate the spindle 200 (FIG. 7) to advance the wire from the wire feed mechanism 104.

With both clamp members 298 and 300 in an open condition, the wire feed mechanism 104 advances the wire to the predetermined extent necessary to position the wire for forming the bulges 58, the leader 68, the tail 72, and the intervals 76 between the bulges. The rotational rate and position of the rotating gripping assembly 292 is precisely controlled by the timed delivery of pulses to the stepper drive motor 294 during this interval to provide enough time for the wire to be advanced. Consequently, the rotational speed of the rotating gripping assembly 292 can be controlled very closely during all portions of each revolution of the rotating gripping assembly 292. By slowing the rotational rate of the rotating gripping assembly 292 during the 90 degree rotational interval when the clamp members 298 and 300 are open, a relatively longer amount of wire can be advanced. Enough wire to form the leader 68 (FIG. 1) of the twist pin 50 may be advanced under these conditions, for example.

Closing the stationary clamp member 298 by the solenoid 330 is also controlled from knowledge of the rotational position of the rotating gripping assembly 292 resulting from the sensor 514 supplying the trigger signal. The number of pulses delivered to the stepper drive motor 294 determines the rotational position that the rotating gripping assembly 292. When the number of pulses supplied to the drive motor 294 positions the rotating gripping assembly 292 so that the actuator arms 392 and 396 are about to contact with the closing pin 502, the controller of the machine 100 delivers current to the solenoid 330, thereby closing the stationary clamp member 298.

After the twist pin configuration has been formed in the wire, it is necessary to sever the twist pin configuration from the continuous wire in order to complete the fabrication of the twist pin. Under such conditions, the wire is advanced until the end 70 of the leader 68 or the end 74 of the tail 72 (FIG. 1) is in a position below the bulge forming mechanism 106, as may be understood by reference to FIGS. 6 and 7. The wire 52 is advanced by the wire feed mechanism 104 through the bulge forming mechanism 106 until a point on the wire is aligned with the point where a laser beam will be trained onto the wire in a cutting chamber 520 (FIGS. 6 and 7). The laser beam device 110 is then activated, and the energy from the laser beam severs the wire by melting it into two pieces, thus forming an end 74 of the in tail 72 on one severed piece and the end 70 of the leader 68 on the other severed piece (FIG. 1). Melting at the ends 70 and 74 fuses the strands 54 and 56 together to simultaneously form the ends 70 and 74 (FIG. 1).

In the context of the present invention, it is desired that a slight tension be applied to the wire while it is severed. To create the tension, gas is delivered to the venturi assembly 540 (FIG. 7) which induces the tension on the wire as it is cut. The tension induced by the venturi assembly is resisted by the spindle 200 and the pinch roller 220 of the wire feed mechanism 104 (FIG. 7) which are non-rotational at this time. The stationary gripping assembly 290 should also be closed to resist the tension created by the venturi assembly 540.

The severed twist pin whose fabrication has just been completed is removed by the inductor mechanism 108 and conveyed through the tube 112 of the twist pinned receiving mechanism 114 and delivered into a receptacle 118 of the cassette 116 (FIGS. 6 and 7). More details concerning the inductor mechanism 108 and the twist pin receiving mechanism 114 are described in the above-referenced and concurrently-filed U.S. patent application Ser. No. 09/780, 981.

Figure 25:
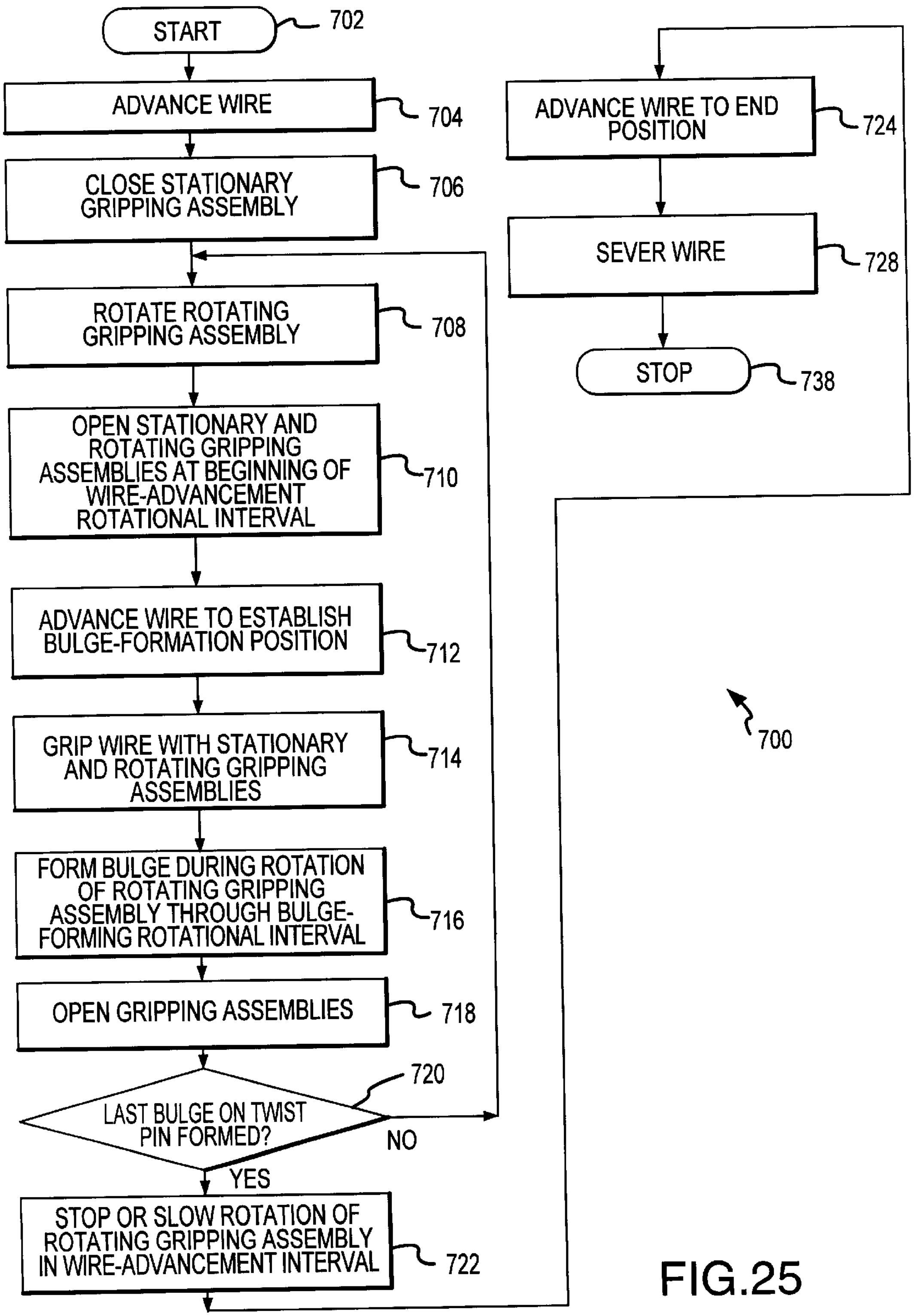
FIG. 25 is a flowchart of the basic methodology of forming bulges while fabricating twist pins according to the present invention and of the functions performed by the twist pin fabricating machine shown in FIG. 6.

The manner in which the above-described bulge forming mechanism 106 functions in conjunction with the wire feed mechanism 104, and the general method of fabricating bulges on the twist pins according to the present invention, is illustrated by a process flow shown at 700 in FIG. 25. The separate operations of the machine and the steps of the method in the process flow 700 are referenced by separate reference numbers. The process flow 700 presumes normal functionality without consideration of error or malfunction conditions.

The process flow 700 begins at step 702. At step 704, wire is unwound from the spool 102 and advanced into the cavity 170 of the wire feed mechanism 104 (FIGS. 6, 7). Step 704 also involves forming and maintaining the S-shaped configuration 234 (FIG. 7).

At step 706, the stationary gripping assembly 290 is closed (FIG. 14) by energizing the solenoid 330 (FIGS. 11, 14). The rotating gripping assembly 294 (FIGS. 9, 10) is rotated by energizing the stepper drive motor 294 (FIG. 8), as shown at step 708. Next, as shown at step 710, the rotating gripping assembly is rotated until it reaches the position at which the rotating gripping assembly is opened (FIG. 21) by the contact of the actuating arm 390 or 394 with the opening trip pin 500 (FIG. 22). Also as part of step 710, the stationary gripping assembly 290 is opened (FIG. 15) as a result of de-energizing the solenoid 330 (FIG. 11) in response to the trigger signal from the sensor 514.

With both the stationary and the rotating gripping assemblies in the open position as a result of executing step 710, the wire is next advanced at step 712 as a result of energizing the precision feed motor 212 with pulses to cause it to rotate the spindle 200 (FIG. 7). The rotating spindle 200 advances slack wire from the S-shaped configuration 234 in the cavity 170 into the bulge forming mechanism 106 (FIG. 7). The wire is advanced at step 712 until the desired location for forming the bulge 58 (FIG. 1) is established. The correct position of the wire is established by counting the number of energizing pulses applied to be precision stepper motor 212.

Once the wire has been positioned at the desired location for the formation of a bulge, at step 712, the wire is gripped by closing both the stationary and the rotating gripping assemblies, as shown at step 714. Closing the stationary gripping assembly (FIG. 14) is achieved by energizing the solenoid 300 (FIG. 11) at a time correlated to the number of pulses supplied to the stepper drive motor 294 (FIGS. 7 and 8) so that the stationary gripping assembly closes at approximately the same time or slightly earlier than the rotating gripping assembly closes. Closing the rotating gripping assembly (FIG. 20) is achieved by rotation of the rotating gripping assembly 292 until one of the actuating arms 392 or 396 contacts the closing trip pin 502 (FIG. 24). Upon execution of step 714, the wire 52 is gripped above and below the position where a bulge 58 (FIG. 1) is to be formed.

A bulge 52 (FIG. 1) is thereafter formed during the rotation of the rotating gripping assembly 292 through the bulge-forming rotational interval, as shown at step 716. The bulge forming rotational interval is that part of a complete revolution of the rotating gripping assembly clockwise from the position shown in FIG. 24 to the position shown in FIG. 22. During this rotational interval, the bulge 58 (FIG. 1) is formed in a single continuous, uninterrupted movement by the action of the rotating gripping assembly 292.

At step 718, the stationary gripping assembly and the rotating gripping assembly are both opened (FIGS. 15 and 21). The stationary gripping assembly is opened by de-energizing the solenoid 330 (FIG. 11) in response to the trigger signal supplied by the sensor 514. The rotating gripping assembly is opened by the contact of one of the actuating arms 590 or 594 with the opening trip pin 500 (FIG. 22).

A determination is thereafter made at step 720 as to whether the last bulge of the twist pin has just been formed. If not, the program flow loops back to step 708, and thereafter steps at 708, 710, 712, 714, 716, 718, and 720 are again executed in a loop. The steps of this loop are repeated, until all of the bulges 58 (FIG. 1) of the twist pin have been formed. Once all of the bulges for the twist pin have been formed, the determination at step 720 causes the program flow to advance to step 722.

The rotating gripping mechanism is stopped or slowed at step 722. The rotational position where the rotating gripping mechanism is slowed or stopped is in that part of the rotational interval where the rotating gripping assembly 292 is opened (FIG. 23), after an actuating arm 390 or 394 of the cam wheel 386 has contacted the open trip pin 500 (FIG. 22). Slowing or stopping the rotating gripping mechanism in the part of its rotational interval where the rotating gripping assembly is opened is achieved by controlling the application of energizing pulses to the stepper drive motor 294 (FIG. 8).

Executing steps 718 and 722 allows the wire to be advanced at step 724. The wire advancement at step 724 positions the wire at a location where ends 70 and 74 (FIG. 1) of the twist pin 50 are to be formed. The position of the wire established at step 724 locates the ends 70 and 74 where the laser beam from the laser device 110 (FIGS. 6, 7) will melt the wire to sever the fabricated twist pin and form the ends 70 and 74.

The laser beam device 110 is actuated and the laser beam melts the wire at the end positions to sever the fabricated twist pin from the wire, as shown at step 728. The air flow from the venturi assembly 540 (FIG. 7) conducts the severed and fabricated twist pin toward the cassette. Until all of the receptacles 118 of the cassette have been fully occupied, twist pins will continue to be fabricated and delivered to the cassette. Once all the receptacles of the cassette have been occupied, the program flow 700 stops at step 738.

In summary of the more detailed explanations of the improvements described above, numerous improvements are obtained by the bulge forming mechanism 106. A single bulge 58 (FIG. 1) is completely formed in a single revolution of the rotating gripping assembly 292, thereby avoiding having to act twice on the strands to untwist them sufficiently to form a single bulge, as was typical with prior art devices. The rotating clamp member 300, and the cam wheel 386 add a relatively small amount of rotational inertia to the rotating gripping assembly 292, thereby allowing its rotational rate to be increased and the acceleration of the rotating gripping assembly 292 to be better controlled and changed. Significant improvements in precision occur by avoiding the use of the complicated and massive clamping devices of the prior art. Such massive devices complicate and prevent adequate control over the equipment and the wire when undergoing speed and acceleration changes. The precise control over the rotational rate and the opening and closing of the clamping members 298 and 300 allows the wire to be advanced precisely and under conditions which allow positioning of the bulges, the leader, the tail and the interval between bulges at predetermined positions in the twist pin.

The improvements available from the bulge forming mechanism 106 also achieve a higher production rate of twist pins. The rotating gripping assembly 292 rotates continuously and fully creates a single bulge during a continuous rotational interval of each complete revolution. During the remaining rotational interval of each revolution, the wire is advanced to allow the bulges to be fabricated sequentially and without lost motion and inefficiency. Advancing the wire from the slack wire S-shaped configuration 234 decouples the rotational inertia of the spool 102 from the advancement of the wire into the bulge forming mechanism 106. Consequently, the wire is more quickly advanced into a desired position in the bulge forming mechanism 106 because it need not be unwound against the resistance and inertia of the wire from the spool 102. The speed at which the bulge forming mechanism 106 forms the bulges need not be reduced to accommodate latencies in advancing the wire. However in those cases where it is necessary to advance a greater amount of wire to form the leader of the twist pin, for example, the rotational rate of the rotating gripping assembly can be slowed during the wire advancing interval. More bulges are therefore created in a shorter amount of time, resulting in fabricating twist pins more efficiently and quickly.

Creating a single bulge as a result of a single revolution achieves improvements over prior techniques requiring more than one separate movement to completely form the bulge. The shape of each bulge formed is also more uniform, consistent and symmetrical as a result of the single bulge-forming movement. The crescent shaped gripping surfaces 486 and 488 grip the wire strands in an oval shape to transfer a greater amount of rotational torque to rotate the wire in the anti-helical direction without slippage when forming the bulge. The shape of the bulges formed is enhanced by avoiding wire slippage. Consistent and more uniformly shaped bulges create better electrical connections between the twist pins and the vias of the printed circuit boards through which the twist pins are inserted. The greater extent of the rotational interval during which the wire is untwisted in the anti-helical direction contributes to the ability to form a single bulge during each revolution of the rotating gripping assembly 292.

Forming each bulge as a single movement during a part of each revolution also contributes to forming the bulges concentrically and coaxially along the length of the wire. Maintaining a coaxial relationship of all the portions of the twist pin along the length of the twist pin assures that the twist pin will be more easily inserted through the aligned vias in the printed circuit boards. There is less likelihood that the wire will be deflected from a coaxial relationship when the bulges are formed from a single continuous movement, compared to the prior art technique of requiring more than one movement to form each bulge.

The formation of the bulges in a continuous, non-reciprocating operation avoids the prior art problems associated with the latency and the acceleration and deceleration forces created by the inertia and the mass of various prior art mechanisms used to form the bulges. Instead, the bulges are formed as a result of continuous, motion-efficient and more rapidly executed movements during which the wire is advanced, gripped, anti-helically rotated and released with each revolution of the rotating gripping assembly.

A presently preferred embodiment of the invention and many of its improvements have been described with a degree of particularity. This description is of a preferred example of implementing the invention and is not necessarily intended to limit the scope of the invention. The scope of the invention is defined by the following claims.

The invention claimed is:

1. A method of forming a bulge in a metallic wire having helically coiled strands by untwisting the strands in an anti-helical direction at a predetermined position to form the bulge as a part of an electrical connector formed from a segment of a length of the wire, comprising the steps of:

gripping the wire with a first clamp member and preventing the wire from moving relative to the first clamp member by moving the first clamp member to a closed position;

gripping the wire with a second clamp member and preventing the wire from moving relative to the second clamp member by moving the second clamp member to a closed position;

positioning the first and second clamp members at spaced apart locations above and below the predetermined location where a bulge is to be formed;

rotating the positioned first and second clamp members relative to one another in at least one complete relative revolution in a relative rotational direction which is anti-helical relative to the strands of the wire; and moving both the positioned first and second clamp members to the closed position during a relative rotational interval of greater than one-half of one complete relative revolution of the positioned clamp members to expand the strands radially outward at the predetermined location relative to the helically coiled strands at other locations along the metallic wire to form the bulge.

2. A method as defined in claim 1 further comprising the step of:

moving both the positioned first and second clamp members to the closed position during a relative rotational interval of approximately three-fourths of a complete relative revolution of the positioned clamp members.

3. A method as defined in claim 1 further comprising the steps of:

retaining the positioned first clamp member in a stationary position during the relative rotational interval; and rotating the positioned second clamp member relative to the positioned first clamp member during the relative rotational interval.

4. A method as defined in claim 1 further comprising the step of:

gripping the wire to reposition the strands into a cross-sectional configuration having a non-uniform radial component at the location of one of the positioned first and second clamp members by moving the one of the first or second clamp members to the closed position.

5. A method as defined in claim 1 further comprising the step of:

normally resiliently biasing at least one of the clamp members to the open position; and moving the positioned one clamp member to the closed position by overcoming force which normally resiliently biases the positioned one clamp member to the open position.

6. A method as defined in claim 1 further comprising the steps of:

normally resiliently biasing at least one of the clamp members to the closed position; and moving the positioned one of the clamp member to the open position by overcoming force which normally resiliently biases the positioned one clamp member to the closed position.

7. A method as defined in claim 1 further comprising the step of:

gripping the wire to reposition the strands into a cross-sectional configuration having a non-uniform radial component at the locations of the positioned first and second clamp members by moving the positioned first and the second clamp members to the closed position.

8. A method as defined in claim 7 further comprising the step of:

gripping the wire with opposing contact surfaces which are crescent shaped to reposition the strands into the cross-sectional configuration having the non-uniform radial component.

9. A method as defined in claim 1 further comprising the step of:

gripping the wire with at least one of the positioned first and second clamping members which has opposing contact surfaces that are crescent shaped to reposition the strands into a cross-sectional configuration having non-uniform radial component.

10. A method as defined in claim 1 further comprising the step of:

releasing the grip on the wire by the first clamp member and allowing the wire to move relative to the first clamp member by moving the positioned first clamp member to an open position;

releasing the grip on the wire by the second clamp member and allowing the wire to move relative to the second clamp member by moving the positioned second clamp member to an open position;

advancing the wire longitudinally along the length of the wire relative to the first and second clamp members when the first and second clamp members are in the open position;

advancing the wire longitudinally along the length of the wire to a predetermined position where the wire is to be severed after all of the bulges have been formed in the segment of the wire; and severing the wire to separate the segment from a remaining length of wire to form the electrical connector after the wire has been advanced to the predetermined position.

11. A method as defined in claim 1 further comprising the step of:

mechanically operating at least one of the positioned first or second clamp members to the closed position.

12. A method as defined in claim 1 further comprising the step of:

electrically operating at least one of the positioned first or second clamp members to the closed position.

13. A method as defined in claim 1 further comprising the step of:

releasing the grip on the wire by the first clamp member and allowing the wire to move relative to the first clamp member by moving the positioned first clamp member to an open position;

releasing the grip on the wire by the second clamp member and allowing the wire to move relative to the second clamp member by moving the positioned second clamp member to an open position; and mechanically operating at least one of the positioned first or second clamp members to the open position.

14. A method as defined in claim 1 further comprising the step of:

releasing the grip on the wire by the first clamp member and allowing the wire to move relative to the first clamp member by moving the positioned first clamp member to an open position;

releasing the grip on the wire by the second clamp member and allowing the wire to move relative to the second clamp member by moving the positioned second clamp member to an open position; and electrically operating at least one of the positioned first or second clamp members to the open position.

15. A method as defined in claim 1 further comprising the step of:

moving both the positioned first and second clamp members to the closed position during a relative rotational interval of less than the complete revolution of the positioned clamp members.

16. A method as defined in claim 1 further comprising the step of:

moving the positioned first and second clamp members to the open position prior to completion of the complete revolution during which the positioned clamp members were closed.

17. A method as defined in claim 1 further comprising the steps of:

forming at least one bulge in the wire in the manner aforesaid;

advancing the wire during the relative rotational interval when the first and second clamp members are in the open position to a predetermined position where the wire is to be severed after each bulge as has been formed in the segment of the wire; and severing the wire to separate the segment from a remaining length of wire to form the electrical connector.

18. A method as defined in claim 1 further comprising the steps of:

forming at least one bulge in the length of wire in the manner aforesaid; and severing the segment from the length of wire to separate the segment in which the one bulge is formed from a remaining length of wire to form the electrical connector.

19. A method as defined in claim 1 further comprising the step of:

gripping the wire by contacting opposite lateral sides of the length of wire.

20. A method as defined in claim 1 further comprising the step of:

temporarily stopping the relative rotation of the positioned first and second clamp members prior to relative rotation through the complete revolution while the first and second clamp members are in the open position.

21. A method as defined in claim 1 further comprising the step of:

opening the positioned first and second clamp members approximately at the same time during the complete relative revolution of the positioned clamp members.

22. A method as defined in claim 1 further comprising the step of:

closing the positioned first and second clamp members approximately at the same time during the complete relative revolution of the positioned clamp members.

23. A method of forming a bulge in a metallic wire having helically coiled strands by untwisting the strands in an anti-helical direction at a predetermined position to form the bulge as a part of an electrical connector formed from a segment of a length of the wire, comprising the steps of:

gripping the wire with a first clamp member and preventing the wire from moving relative to the first clamp member by moving the first clamp member to a closed position;

gripping the wire with a second clamp member and preventing the wire from moving relative to the second clamp member by moving the second clamp member to a closed position;

positioning the first and second clamp members at spaced apart locations above and below the predetermined location where a bulge is to be formed;

rotating the positioned first and second clamp members relative to one another in at least one complete relative revolution in a relative rotational direction which is anti-helical relative to the strands of the wire;

moving both the positioned first and second clamp members to the closed position during a relative rotational interval of greater than one-half of one complete relative revolution of the positioned clamp members to expand the strands radially outward at the predetermined location relative to the helically coiled strands at other locations along the metallic wire to form the bulge;

releasing the grip on the wire by the first clamp member and allowing the wire to move relative to the first clamp member by moving the positioned first clamp member to an open position;

releasing the grip on the wire by the second clamp member and allowing the wire to move relative to the second clamp member by moving the positioned second clamp member to an open position;

moving both the first and second clamp members into the open position during a relative rotational interval of less than one-half of a complete relative revolution of the positioned clamp members.

24. A method as defined in claim 23 further comprising the step of:

advancing the wire longitudinally relative to the first and second clamp members when the first and second clamp members are in the open position.

25. A method as defined in claim 24 further comprising the step of:

advancing the wire longitudinally to another predetermined position at which another bulge is to be formed after having formed a previous bulge.

26. A method as defined in claim 24 further comprising the step of:

slowing the relative rotation of the first and second clamp members relative to one another during the relative rotational interval when the positioned first and second clamp members are in the open position.

27. A method as defined in claim 24 further comprising the step of:

temporarily stopping the relative rotation of the first and second clamp members relative to one another during the relative rotational interval when the positioned first and second clamp members are in the open position.

28. A method as defined in claim 24 further comprising the step of:

controlling the relative rotational rate of the first and second clamp members relative to one another during the relative rotational interval when the positioned first and second clamp members are in the open position to establish selective time intervals during which the clamp members occupy the open position.

29. A method as defined in claim 23 further comprising the steps of:

establishing a time period of the relative rotational interval when the positioned first and second clamp members are in the open position independently of a time period of the relative rotational interval when the positioned first and second clamp members are in the closed position by controlling the relative rotational rate of the positioned first and second clamp members.

30. A method as defined in claim 23 further comprising the steps of:

advancing the wire during the relative rotational interval when the first and second clamp members are in the open position to a predetermined position where the wire is to be severed after all of the bulges have been formed in the segment of the wire; and severing the wire to separate the segment from a remaining length of wire to form the electrical connector.

31. A method of forming a bulge in a metallic wire having helically coiled strands by untwisting the strands in an anti-helical direction at a predetermined position to form the bulge as a part of an electrical connector formed from a segment of a length of the wire, comprising the steps of:

gripping the wire with a first clamp member and preventing the wire from moving relative to the first clamp member by moving the first clamp member to a closed position;

gripping the wire with a second clamp member and preventing the wire from moving relative to the second clamp member by moving the second clamp member to a closed position;

positioning the first and second clamp members at spaced apart locations above and below the predetermined location where a bulge is to be formed;

rotating the positioned first and second clamp members relative to one another in at least one complete relative revolution in a relative rotational direction which is anti-helical relative to the strands of the wire;

moving both the positioned first and second clamp members to the closed position during a relative rotational interval of greater than one-half of one complete relative revolution of the positioned clamp members to expand the strands radially outward at the predetermined location relative to the helically coiled strands at other locations along the metallic wire to form the bulge; and moving the first and second clamp members to the open position at approximately at the same time during a relative revolution of the positioned clamp members.

32. A method of forming a bulge in a metallic wire having helically coiled strands by untwisting the strands in an anti-helical direction at a predetermined position to form the bulge as a part of an electrical connector formed from a segment of a length of the wire, comprising the steps of:

gripping the wire with a first clamp member and preventing the wire from moving relative to the first clamp member by moving the first clamp member to a closed position;

gripping the wire with a second clamp member and preventing the wire from moving relative to the second clamp member by moving the second clamp member to a closed position;

positioning the first and second clamp members at spaced apart locations above and below the predetermined location where a bulge is to be formed;

rotating the positioned first and second clamp members relative to one another in at least one complete relative revolution in a relative rotational direction which is anti-helical relative to the strands of the wire; and moving both the positioned first and second clamp members to the closed position during a relative rotational interval of greater than one-half of one complete relative revolution of the positioned clamp members to expand the strands radially outward at the predetermined location relative to the helically coiled strands at other locations along the metallic wire to form the bulge; and moving the positioned first and second clamp members to the closed position at approximately at the same time during a relative revolution of the clamp members.

33. A method of forming a bulge in a metallic wire having helically coiled strands by untwisting the strands in an anti-helical direction at a predetermined position to form the bulge as a part of an electrical connector formed from a segment of a length of the wire, comprising the steps of:

gripping the wire with a first clamp member and preventing the wire from moving relative to the first clamp member by moving the first clamp member to a closed position;

gripping the wire with a second clamp member and preventing the wire from moving relative to the second clamp member by moving the second clamp member to a closed position;

positioning the first and second clamp members at spaced apart locations above and below the predetermined location where a bulge is to be formed;

rotating the positioned first and second clamp members relative to one another in at least one complete relative revolution in a relative rotational direction which is anti-helical relative to the strands of the wire; and moving both the positioned first and second clamp members to the closed position during a relative rotational interval of greater than one-half of one complete relative revolution of the positioned clamp members to expand the strands radially outward at the predetermined location relative to the helically coiled strands at other locations along the metallic wire to form the bulge;

retaining the positioned first clamp member in a stationary position during each complete relative revolution; and rotating the positioned second clamp member in complete revolutions in a single rotational direction relative to the first clamp member during each complete relative revolution; and moving the second clamp member to the open position at a first predetermined point in each revolution of the second clamp member.

34. A method as defined in claim 33 further comprising the step of:

moving the second clamp member to the closed position at a second predetermined point in each revolution of the second clamp member, the first and second predetermined points being different from one another.

* * * * *